(12) United States Patent
Gao

(10) Patent No.: US 11,882,676 B2
(45) Date of Patent: Jan. 23, 2024

(54) SERVER AND RACK CODESIGN WITH A HIGH RELIABLE STRUCTURE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/407,967

(22) Filed: Aug. 20, 2021

(65) Prior Publication Data

US 2023/0056298 A1  Feb. 23, 2023

(51) Int. Cl.
*H05K 7/14* (2006.01)
*H05K 7/20* (2006.01)

(52) U.S. Cl.
CPC ....... *H05K 7/20772* (2013.01); *H05K 7/1492* (2013.01)

(58) Field of Classification Search
CPC .......... H05K 7/20763; H05K 7/20772; H05K 7/20781; H05K 7/2079; H05K 7/20327; H05K 7/20818; H05K 7/1492; H05K 7/1485; H05K 7/1487; H05K 7/1488; H05K 7/1489; H01R 13/4538; A61M 2039/267; A61M 39/20; F16L 2201/80; F16L 2201/44; F16L 2201/20; F16L 55/115; F16L 37/138; F16L 27/107; F16L 27/113
USPC ..................................................... 361/679.46
See application file for complete search history.

(56) References Cited

U.S. PATENT DOCUMENTS

| | | | | |
|---|---|---|---|---|
| 4,493,010 A | * | 1/1985 | Morrison | H05K 7/20636 62/331 |
| 5,599,196 A | * | 2/1997 | Powell | H01R 13/4538 439/140 |
| 11,553,627 B1 | * | 1/2023 | Gregory | H05K 7/20781 |
| 2007/0274043 A1 | * | 11/2007 | Shabany | H05K 7/20645 361/696 |
| 2008/0084667 A1 | * | 4/2008 | Campbell | H05K 7/20736 165/80.4 |
| 2009/0260777 A1 | * | 10/2009 | Attlesey | H01L 23/473 165/104.33 |
| 2014/0114292 A1 | * | 4/2014 | Tachizaki | F16L 37/30 604/533 |
| 2016/0128238 A1 | * | 5/2016 | Shedd | F25B 41/42 361/679.47 |
| 2020/0163251 A1 | * | 5/2020 | Chopra | H05K 7/20636 |

* cited by examiner

*Primary Examiner* — Adrian S Wilson
*Assistant Examiner* — Gage Crum
(74) *Attorney, Agent, or Firm* — WOMBLE BOND DICKINSON (US) LLP

(57) ABSTRACT

Methods, systems, and devices for designing and implementing power and cooling fluid in a computing environment such as an electronics rack are disclosed. The disclosed methods and systems may provide for a high degree of power distribution and cooling fluid distribution reliability. To provide for a high degree of reliability, the system may include a number of protective features that may reduce the likelihood of connectors used for power and cooling fluid distribution from being damaged. The system may also provide for segregation of power distribution components from cooling fluid distribution components. The rack configurations include codesign of the server and rack to form the physical segregation. The segregation may reduce the chance of these components impacting the operation of other components.

18 Claims, 21 Drawing Sheets

SERVER AND RACK CODESIGN WITH A HIGH RELIABLE STRUCTURE

FIELD OF THE INVENTION

Embodiments of the present invention relate generally to distribution of power and cooling fluid in servers. More particularly, embodiments of the invention relate to reliability of power and cooling fluid distribution for servers in electronic racks.

BACKGROUND

Cooling is a prominent factor in a computer system and data center design. The number of high performance electronics components and devices such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime.

In addition to cooling, power distribution in data center design is another prominent factor. Power consumption by components in a computer system environment has steadily increased over time. Interruptions in power to these components may prevent the computer systems from operating properly or at reduced levels of performance. The power delivery system design in a liquid cooling rack may contribute to reliability and safety of the system.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
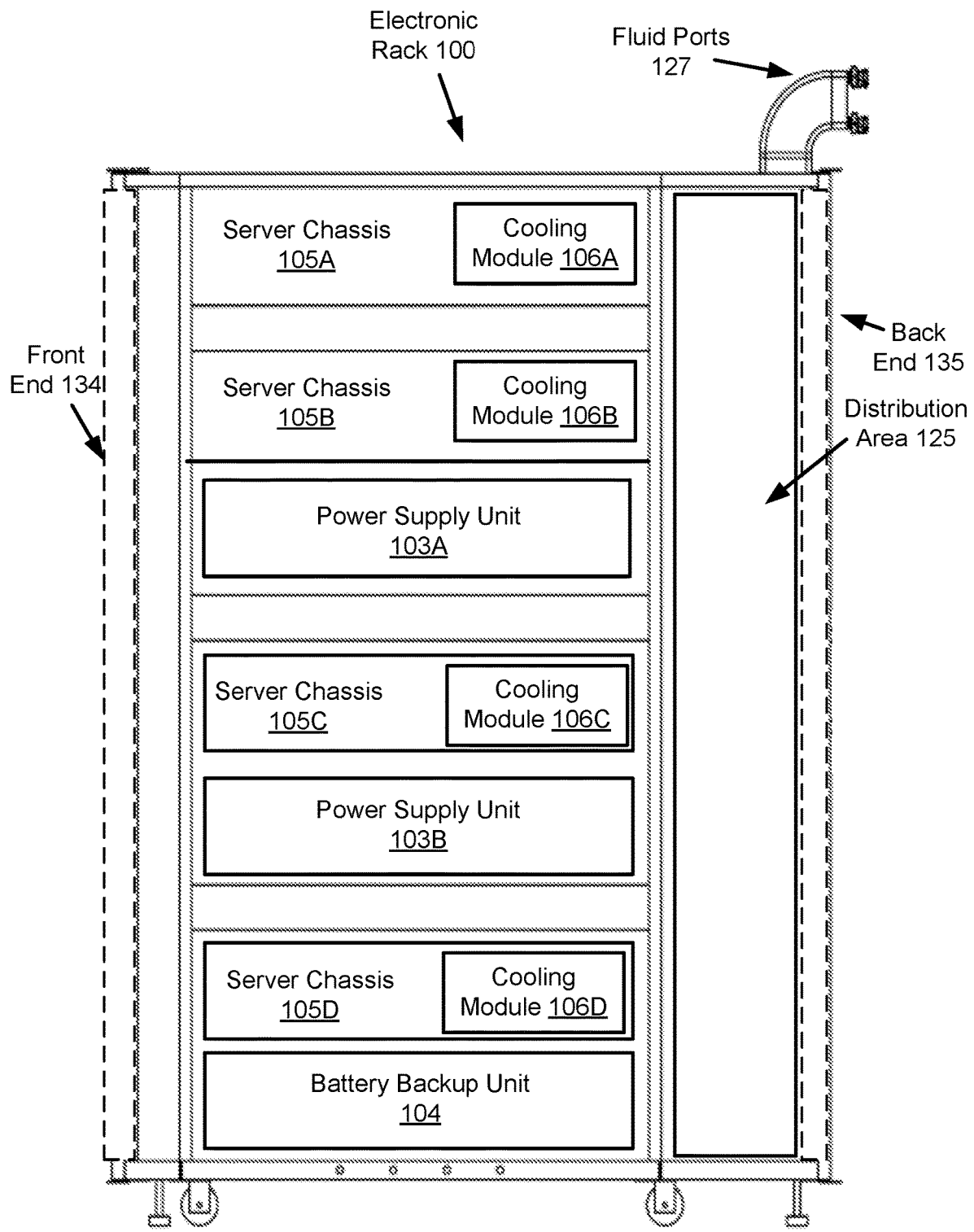
FIG. 1 shows a diagram of an electronic rack according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In general, embodiments disclosed herein provide methods, systems, and devices for distributing power and cooling fluid in a computing environment such as a data center. The disclosed methods and systems may provide for a high degree of power distribution and cooling fluid distribution reliability. To provide for a high degree of reliability, the system may include a number of protective features that may reduce the likelihood of connectors used for power and cooling fluid distribution from being damaged. The system may also provide for segregation of power distribution components from cooling fluid distribution components, which may also impact each other's operation.

For example, consider a scenario where a server chassis is moved into an electronic rack prior to and throughout the movement process fluid and power connectors on the server chassis may be impacted by other components during the movement. These impacts may damage or misalign these components thereby disrupting their ability to make connections with corresponding components in an electronic rack. To reduce the likelihood of these components form being impacted, a server chassis in accordance with embodiments disclosed herein may include protective structures that cover (partially or totally) the components prior to when the server chassis is positioned in an electronic rack. Covering these components may prevent the components from being impacted by other structures.

In another example, consider a scenario where a server chassis is installed in an electronic rack. To cool components inside of the server chassis, the server chassis may be fluidly connected to a source of cooling fluid. However, these fluid connections may leak or otherwise allow cooling fluid to escape (e.g., due to misalignment of fluid ports). The escaped (e.g., leaked) cooling fluid may disrupt the operation of power busbars, power clips, or other components by shorting them out, changing their electrical resistance, or otherwise impacting their operation, or it may cause catastrophic impact or damage. Embodiments disclosed herein may provide an electronic rack configuration in which such components are segregated from one another to reduce the likelihood of (or prevent entirely) escaped cooling fluid from impacting the operation of power components.

In one embodiment, an electronic rack includes a main region, server chassis arranged in a stack in the main region, two fluid system regions, and a power region. At least one of the server chassis may include fluid ports to receive cooling fluid, a power clip to receive power, and a first structure to: protect the fluid ports from damage while the server chassis is not positioned in a main region and expose the fluid ports while the server chassis is positioned in the main region. The two fluid system regions may be for distributing the cooling fluid to the server chassis. The power region may be segregated from the two fluid system regions. The power region may be for distributing power to the server chassis with the power clip.

The server chassis may also include a cooling module positioned to cool, with the cooling fluid, a server board. The cooling module may be in fluid communication with the fluid ports.

The server chassis may also include a second structure positioned to protect the power clip from damage while the server chassis is not positioned in the main region. The second structure may physically expose the power clip while the server chassis is positioned in the main region and cover the power clip while the server chassis is positioned outside of the main region.

The first structure may expose the fluid ports by physically exposing the fluid ports while the server chassis is positioned in the main region, and protect the fluid ports by covering the fluid ports while the server chassis is positioned outside of the main region.

The first structure may include an extension panel to move between a first position and a second position. The extension panel may be retracted in the second position to physically expose the fluid ports. The extension panel may be extended in the first position to physically surround the fluid ports.

The server chassis may also include an electronics area for housing: a server board, and a cooling module in fluid communication with the fluid ports; and a power area for housing a power device operably connected to the power clip to receive the power. The first structure may include a pair of extension panels positioned with a rear side of the first server chassis, the pair of extension panels may be positioned on opposite sides of the power area and segregated from the power area, and all of the pair of extension panels and the power area may be positioned on one side of the electronics area.

The electronic rack may also include hardware panels positioned between the two fluid system regions and the power region. The hardware panels may segregate the two fluid system regions from the power region.

The electronic rack may also include a first rack manifold positioned in a first fluid system region of the two fluid system regions for fluid communication with the fluid ports while the server chassis is positioned in the main region. The electronic rack may further include a second rack manifold positioned in a second fluid system region of the two fluid system regions for the fluid communication with the fluid ports while the server chassis is positioned in the main region.

The two fluid system regions may be positioned along a rear of the electronic rack and the two fluid system regions are separated from each other by the power region, the two fluid system regions may be adapted to receive fluid distribution systems to distribute the cooling fluid.

The electronic rack may also include a fluid distribution system positioned in one of the two fluid system regions. The fluid distribution system may be fluidly connected to the fluid ports by moving the first structure to a retracted position that exposes the fluid ports, the first structure being moved to the retracted position by applying pressure to the first structure while the server chassis is installed in the electronic rack.

By implementing a system as discussed above, a hardware design for electronic rack power and cooling fluid delivery may be provided. The design be easily integrated into existing electronic racks. In an embodiment, the hardware design accommodates different electronic rack architectures. The embodiments disclosed may provide for full segregation of liquid cooling systems and power systems thereby reducing the likelihood of these systems from impacting one another. The embodiments disclosed may also provide for a high reliability design by reducing the likelihood that connectors may be damaged prior to and during installation of server chassis in electronic racks. A system in accordance with embodiments may be easy to operate and require little oversight. The system may also be compatible with existing facility implementations and may not need or benefit from changes to existing facilities. The system may also be deployed for different data center architectures.

FIG. 1 is block diagram illustrating an electronic rack according to one embodiment. Electronic rack 100 may represent any of the electronic racks as described throughout this application. According to one embodiment, electronic rack 100 includes, but is not limited to, one or more power supply units 103A-103B, battery backup unit 104, and one or more server chassis 105A-105D (collectively referred to as server chassis 105).

Server chassis 105 may be inserted into an array of server slots (e.g., standard shelves) respectively from front end 134 or back end 135 of electronic rack 100. Although there are four server chassis 105A-105D shown here, additional or fewer server chassis 105 may be maintained within electronic rack 100. Also note that the particular positions of power supply units 103A-103B, battery backup unit 104, and/or server chassis 105 are shown for purposes of illustration only; other arrangements or configurations of these components may also be implemented. In one embodiment, electronic rack 100 can be either open to the environment or partially contained by a rack container.

Each of server chassis 105 may include one or more IT components (e.g., central processing units or CPUs, general/graphic processing units (GPUs), memory, and/or storage devices). Each IT component may perform data processing tasks. One or more of the IT components may execute software stored in a storage device or other persistent storage medium. The software may be loaded into the memory, and executed by one or more processors (e.g., IT components) to perform the data processing tasks.

Server chassis 105 may include a host server (referred to as a host node) coupled to one or more compute servers (also referred to as computing nodes, such as CPU server and GPU server, any of which may be implemented with the server chassis 105). The host server (having one or more CPUs) may interface with clients over a network (e.g., Internet) to receive a request for a particular service such as storage services (e.g., cloud-based storage services such as backup and/or restoration), processing services, or any other type of services.

In response to the request, the host server may execute an application to perform certain operations (e.g., image processing, deep data learning algorithms or modeling, etc., as, for example, a part of a software-as-a-service (SaaS) platform). In response to the request, the host server may distribute the tasks to one or more of the computing nodes or compute servers (e.g., having one or more CPUs, GPUs, other types of special purposes hardware devices, etc.) managed by the host server. The compute servers and/or host server may perform the tasks, which may consume electrical power and generate heat during the operations carried out to perform the tasks.

To manage the heat generated during operation, any of server chassis 105 may include any number of cooling modules 106A-106D (collectively, cooling modules 106). The cooling modules 106 may cool corresponding IT components. In one embodiment, the cooling modules 106 are fluid cooling devices. The cooling modules 106 may receive a cooling fluid (e.g., from components positioned in distribution area 125) and transfer heat generated by the IT components into the cooling fluid thereby cooling the IT components. The cooling fluid may be circulated through the cooling modules 106 thereby removing heat from server chassis 105. The cooling fluid may be circulated to other systems (not shown) to discharge the removed heat from the cooling fluid thereby allowing the cooling fluid to be circulated back to the cooling modules 106 for heat removal.

To facilitate circulation of fluid to server chassis 105, fluid connections between server chassis 105 and fluid distribution components in distribution area 125 may need to be established. Server chassis 105 may include one or more structural features used to protect fluid connectors on server chassis 105 from being damaged (e.g., during installation in electronic rack 100, while outside of electronic rack 100, etc.). By doing so, the fluid connections to server chassis 105 may be more likely to be made successfully thereby reducing the likelihood of cooling fluid leaks from being formed. The server chassis 105 may include similar structural features to protect electrical connections used to receive power from power supply units 103 or other power sources.

To provide power to server chassis 105 and manage heat generated by the devices (IT components and/or other devices) in the server chassis 105, electronic rack 100 may include distribution area 125. Components usable to (i) distribute power to various components positioned in electronic rack 100 and (ii) remove heat from various components positioned in electronic rack 100 may both be positioned in distribution area 125. In an embodiment, the components that provide these respective functions are segregated from one another in distribution area 125. Segregating these components from one another may reduce the likelihood of these components impacting the operations of the other components.

For example, consider a scenario where power distribution components and cooling fluid distribution components are both positioned in distribution area 125, but are not segregated from each other. If cooling fluid escapes from the cooling fluid distribution components, then the cooling fluid may disrupt the function of the power distribution components. However, if these components are segregated from one another, then even cooling fluid that escapes from the cooling fluid distribution components (e.g., due to leaks or other issues) may be unlikely to disrupt the operation of the power distribution components by virtue of the segregation between these components.

To facilitate segregation of these components from one another, the server chassis 105 may also include structures that contribute to the segregation. For example, the server chassis 105 may have shapes that are usable to segregate various components from one another in the distribution area 125.

Power supply units 103A-103B (collectively, power supply units 103) may receive power from an external supply (such as a power grid), convert it to a type of power that is compatible with other components in electronic rack 100 such as server chassis 105 and battery backup unit 104, and distribute the converted power to other components such as server chassis 105. For example, power supply units 103 may receive alternating current from an external supply, convert the alternating current to direct current, and distribute the direct current to the server chassis 105 and/or battery backup unit 104 with power distribution components (e.g., one or more busbars) positioned in distribution area 125.

Like power supply units 103, battery backup unit 104 may also distribute power to other components in electronic rack 100. However, battery backup unit 104 may do so selectively while power from other sources (e.g., a grid) is not available. For example, when power is available from other sources, battery backup unit 104 may charge batteries (or other power storage devices) with power from the power supply units 103 and/or directly from the grid or other sources. When power from the other sources is unavailable, battery backup unit 104 may extract power from the power storage devices and provide the extracted power to the other components (e.g., server chassis 105). Battery backup unit 104 may also be used for other purposes (e.g., load balancing/smoothing/etc.). To obtain and distribute power, battery backup unit 104 may utilize the same (or different) power distribution components positioned in distribution area 125 utilized by the power supply units 103.

Electronic rack 100 may also include fluid ports 127 or other structures that allow cooling fluid and/or power to flow through distribution area 125 to the server chassis 105, power supply units 103, and/or other components positioned in electronic rack 100. The fluid ports 127 may attach or be attached to cooling fluid distribution components positioned in distribution area 125.

Figure 2A:
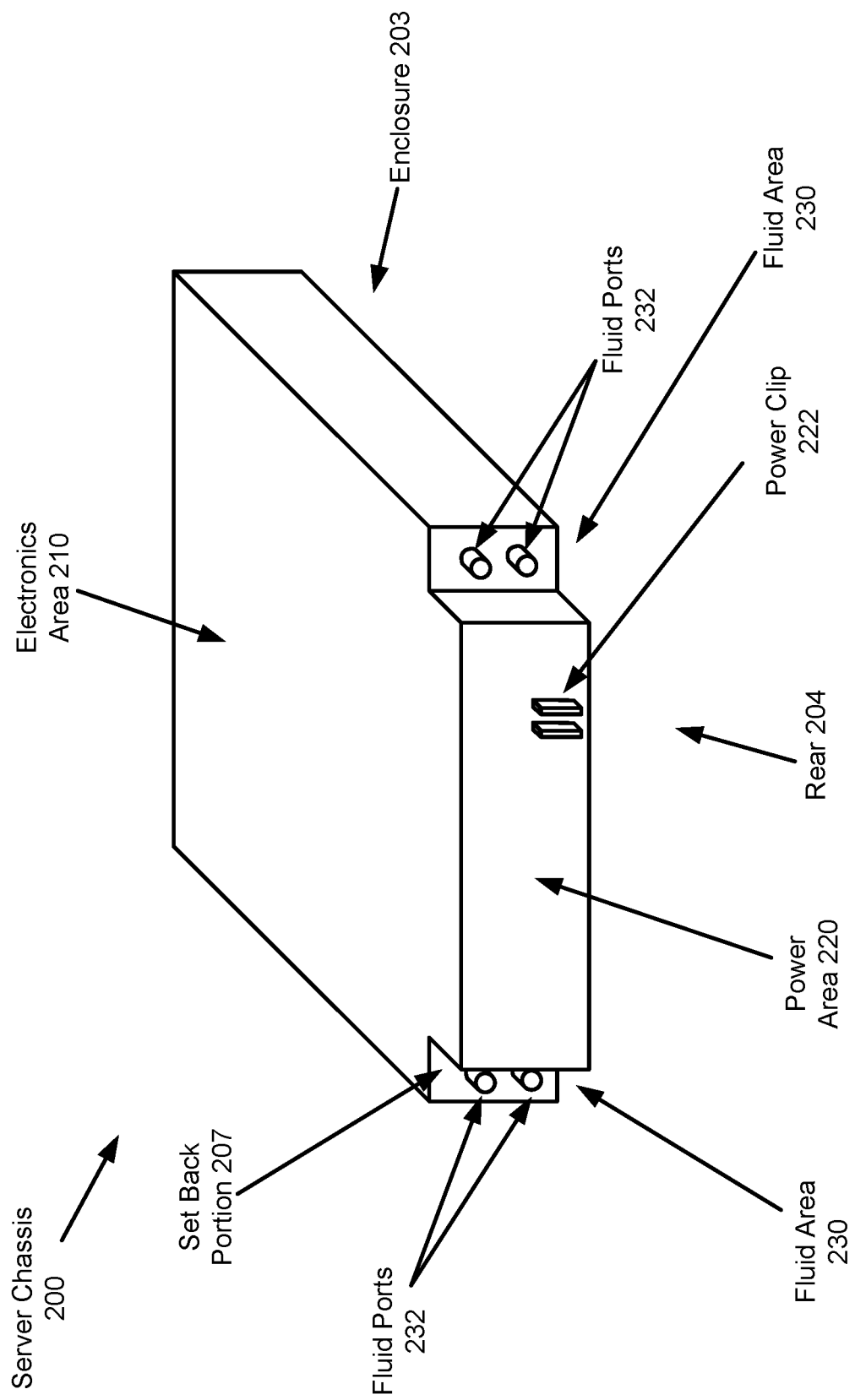
FIG. 2A shows a first diagram of a server chassis according to one embodiment.

Turning to FIG. 2A a diagram of an example server chassis 200 in accordance with one or more embodiments is shown. The example server chassis 200 may be similar to the server chassis discussed with respect to FIG. 1.

Server chassis 200 may include one or more computing devices. The computing devices may provide computer implemented services (in isolation and/or in cooperation with other computing devices). When operating, the computing devices may consume electrical power and generate heat. To provide its functionality, server chassis 200 may include enclosure 203, an electronics area 210, a power area 220, one or more power clips 222, a fluid area 230, and one or more fluid ports 232. Each of these components is discussed below.

Enclosure 203 may include a physical device having a shape and size corresponding to a standard or other pre-agreed upon structure for devices that are to be positioned in an electronic rack. For example, enclosure 203 may include a rectangular structure with openings and/or other structures that facilitate integration of server chassis 200 with electronic racks (or other types of structures for arranging components of a computing environment). Enclosure 203 may include rails (not shown) or other structures to position server chassis 200 in an electronic rack.

A portion of enclosure 203 near a rear 204 (which may be positioned in distribution area 125 while the server chassis 200 is in an electronic rack) may have a shape adapted for interfacing with other components and/or forming segregations between components in distribution area 125 while server chassis 200 is positioned in an electronic rack. For example, the portion of enclosure 203 may include set back portions (e.g., 207) that are set back from other portions. The setback portions 207 and other portions may define fluid areas 230 for interfacing with cooling fluid distribution components in distribution area 125. In one embodiment, a feature of the set back 207 portion is that it is extended when compared with the fluid areas 230. For example, the fluid areas 230 may have a shape and size corresponding to and/or complementary to a cooling fluid distribution component positioned in (or to be positioned in) distribution area 125. Fluid ports 232 may be positioned with the setback portions 207 to form fluid connections with the cooling fluid distribution components positioned (at least partially) in the fluid areas 230 while the server chassis 200 is positioned in an electronic rack. As will be discussed below, other components used to segregate fluid distribution components from electrical power distribution components may also be positioned in fluid area 230 while server chassis 200 is positioned in an electronic rack. While the fluid ports 232 are illustrated in FIG. 2A with specific numbers of ports, groupings, and locations, server chassis 200 may include different numbers of fluid ports, the fluid ports may be grouped differently and/or positioned differently from that shown in FIG. 2A without departing from embodiments disclosed herein. In one embodiment, the fluid ports are blind mating quick disconnects.

Electronics area 210 may correspond to a portion of the interior of enclosure 203. Various types of components (such as server boards forming a computing device) may be positioned in electronics area 210. Corresponding devices (e.g., cooling modules, heat sinks, etc.) for cooling all, or a portion, of these various types of components may also be positioned in electronics area 210. A portion of the devices that utilize cooling fluid to cool components may be in fluid communication with the fluid ports 232 to facilitate circulation of cooling fluid to these devices. Refer to FIGS. 2D-2E and 3A-3D for additional details regarding components that may be positioned in electronics area 210. The design enables a physical segregation of the fluid and the power.

Power area 220 may correspond to a portion of the interior of enclosure 203. Various types of power components may be positioned in power area 220. These components may receive power from other sources with power clip 222 and distribute the power to the components positioned in electronics area 210. Power area 220 may be segregated from the fluid ports 232 inside of enclosure 203 to reduce the likelihood of the power components being impacted by cooling fluid leaks. Refer to FIGS. 3D and 3E for additional details regarding segregations inside of enclosure 203. Refer to FIGS. 2D-2E and 3A-3D for additional details regarding the power components that may be positioned in power area 220.

While server chassis 200 is illustrated in FIG. 2A with one power clip 222, server chassis 200 may include any number of power clips without departing from embodiments disclosed herein.

Figure 2B:
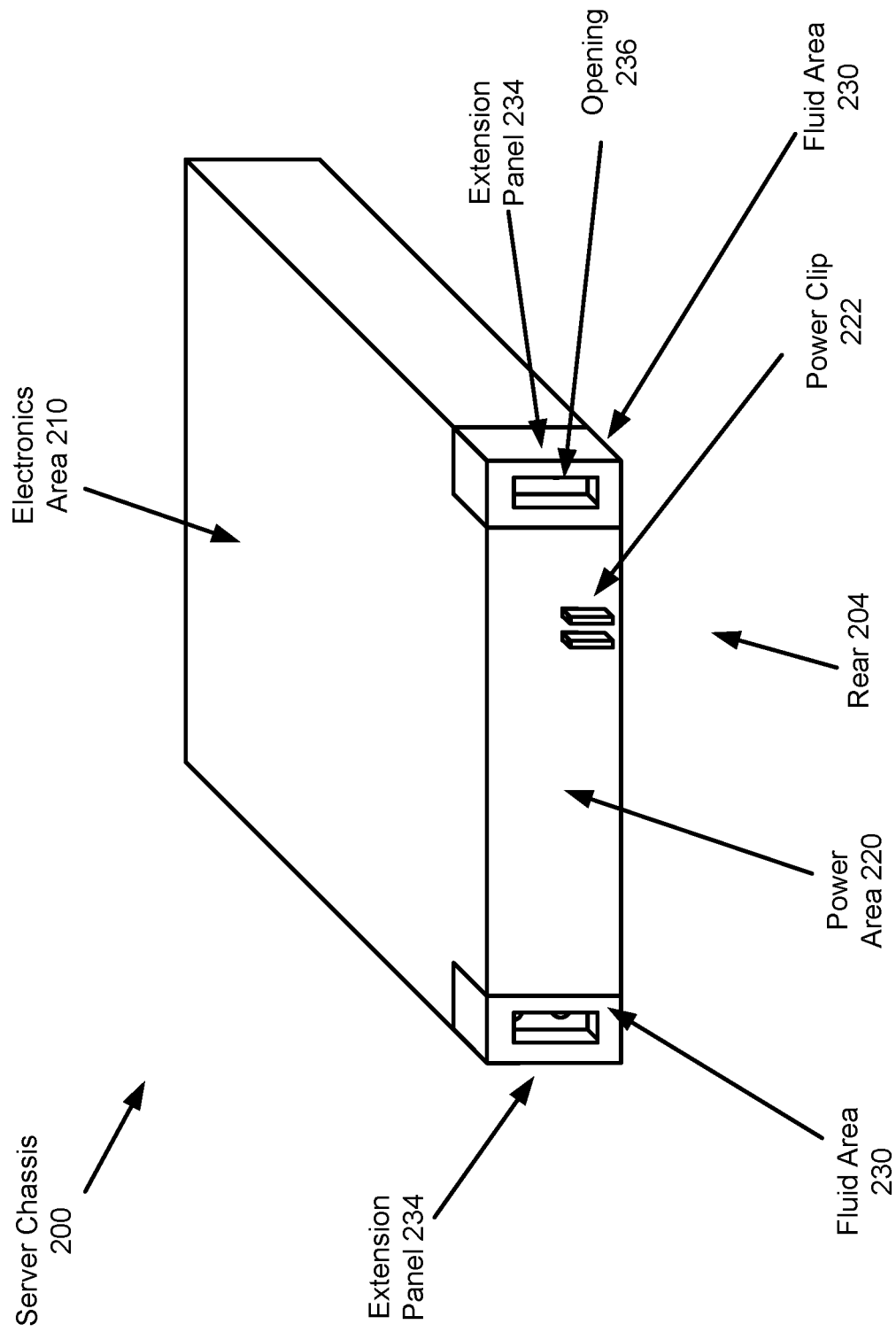
FIG. 2B shows a second diagram of a server chassis according to one embodiment.
Figure 2C:
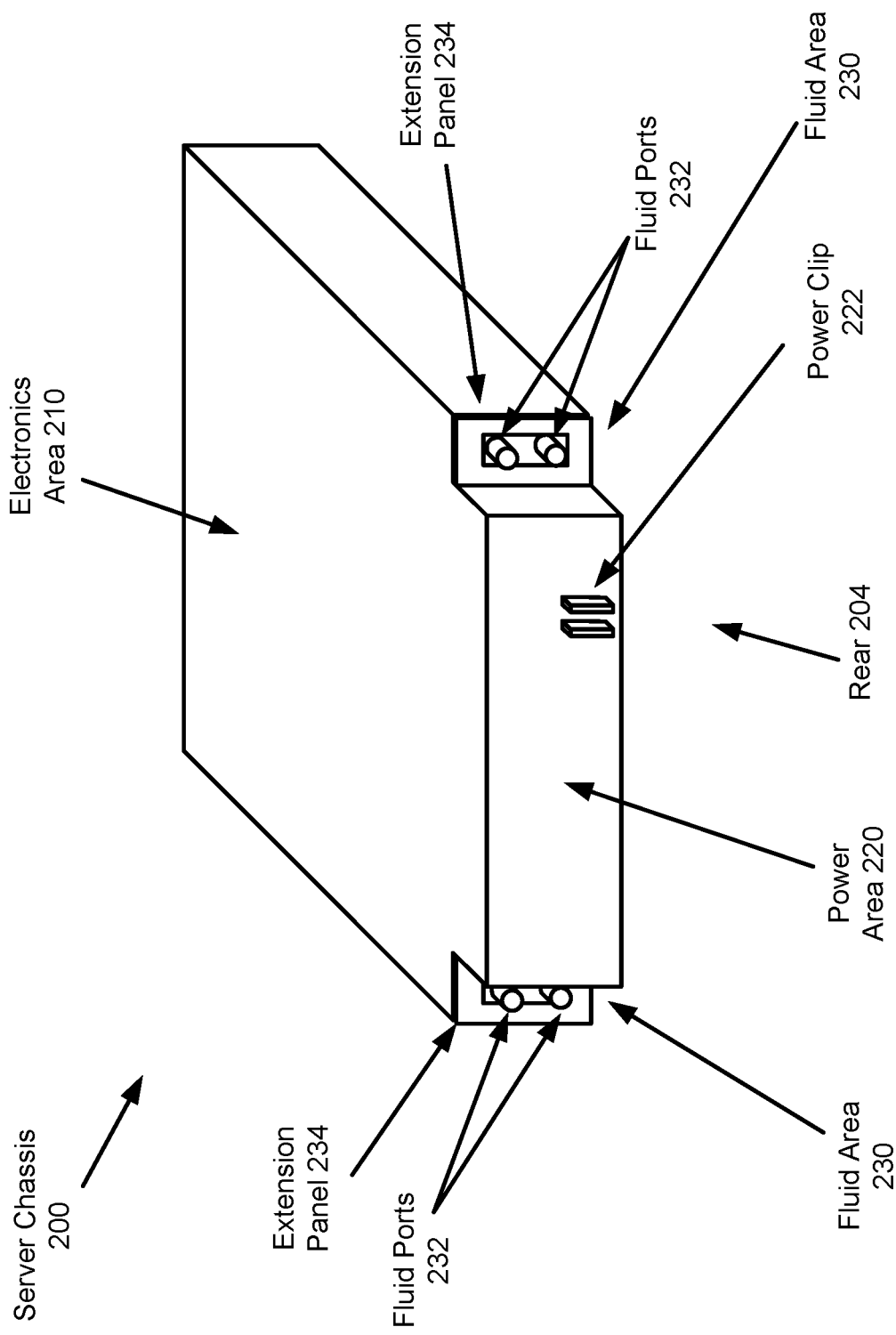
FIG. 2C shows a third diagram of a server chassis according to one embodiment.

Turning to FIG. 2B, a diagram of server chassis 200 in accordance with one or more embodiments is shown. As seen in FIG. 2B, server chassis 200 may include structures for protecting fluid ports while the server chassis 200 is not positioned in an electronic rack. The structures may include extension panels 234. The extension panels 234 may include physical structures that cover the fluid ports while the extension panels 234 are in a first position and expose the fluid ports while the extension panels 234 are in a second position. In FIG. 2B, the extension panels 234 are illustrated in a first position. In FIG. 2C, the extension panels 234 are illustrated in a second position.

As seen in FIG. 2B, the extension panels 234 may include one or more openings 236 proximate to a rear 204 of the enclosure 203. The openings 236 may allow for the extension panels 234 to transition between the first and second positions without contacting the fluid ports 232.

The extension panels 234 may be adapted to preferentially move to the first position to cover the fluid ports. For example, the extension panels 234 may be attached to the enclosure 203 with sliding rails and retention mechanisms (e.g., return springs or other mechanisms) to move the extension panels 234 to the first position unless load is applied to overcome force applied by the retention mechanisms. In some embodiments, the extension panels 234 include locking mechanisms to lock the extension panels 234 in the first position or the second position. For example, the extension panels 234 may include bolts, nuts, or other mechanical means for locking the extension panel 234 with respect to the enclosure 203 thereby keeping the fluid ports covered or exposed.

Turning to FIG. 2C, a diagram of server chassis 200 in accordance with one or more embodiments is shown. In FIG. 2C, the extension panels 234 are illustrated in a second position in which the fluid ports 232 are exposed. In this position, the fluid ports 232 may be able to make fluid connections to other components. For example, as seen in FIG. 2B, the fluid ports 232 may be covered (e.g., partially) by the extension panels 234 while the extension panels 234 are in the first position. In contrast, the fluid ports 232 may be exposed (e.g., to engage with cooling liquid distribution components such as a set of connectors on the rack manifold) while the extension panels 234 are in the second position. In this configuration, the fluid ports 232 may be able to be attached to other components such as cooling fluid distribution components.

Figure 2D:
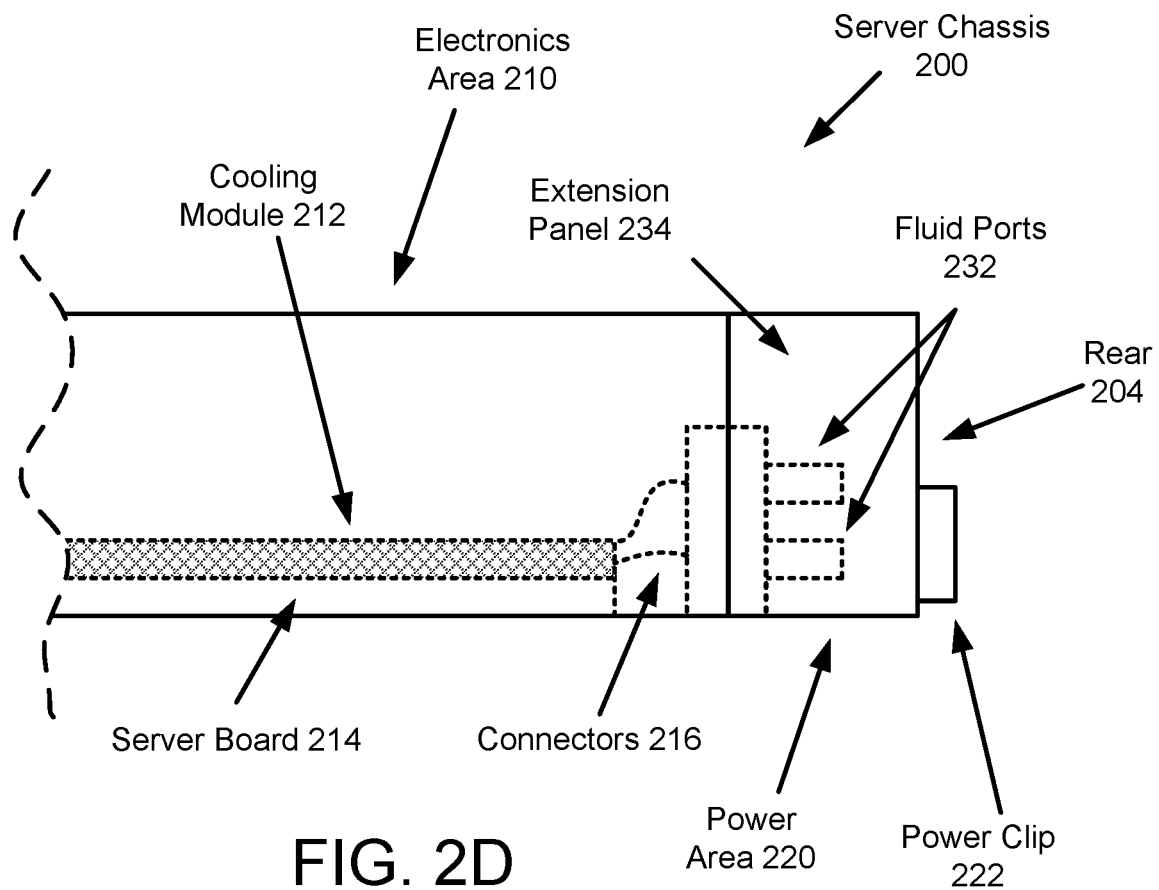
FIG. 2D shows a first side view diagram of a server chassis according to one embodiment.
Figure 2E:
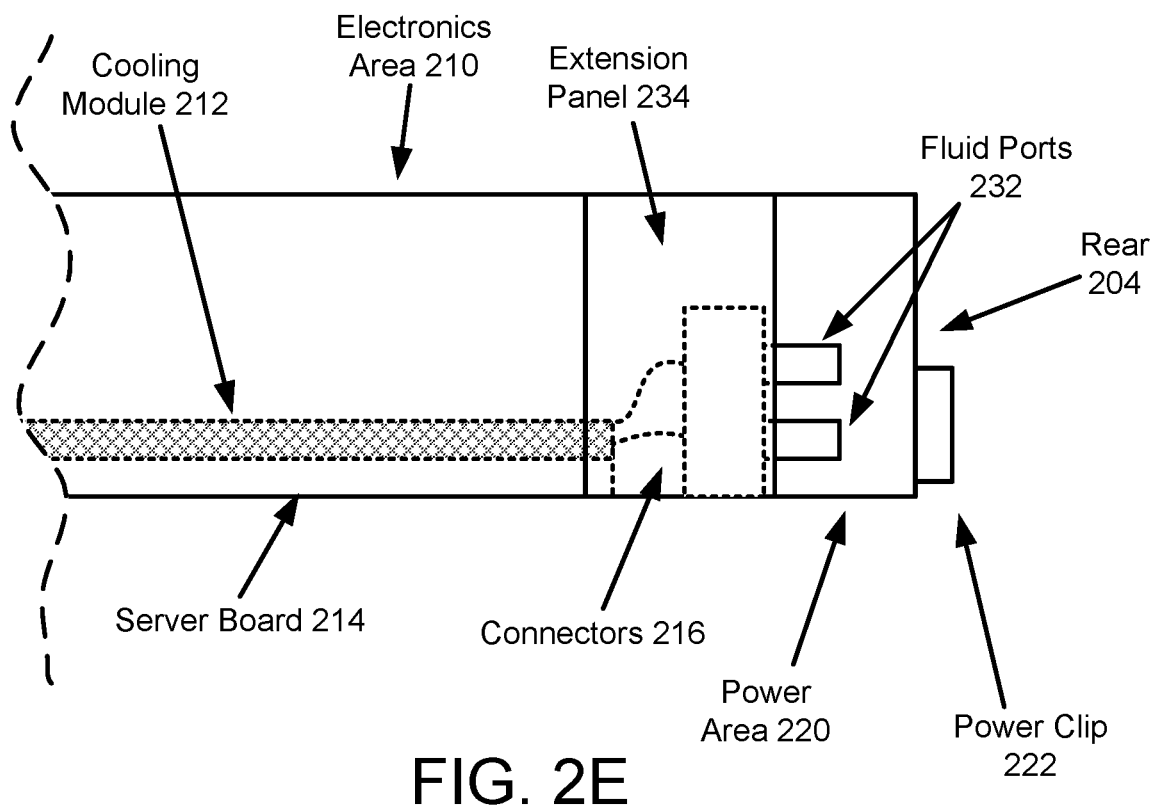
FIG. 2E shows a second side view diagram of a server chassis according to one embodiment.

Turning to FIGS. 2D and 2E, side view diagrams of server chassis 200 in accordance with one or more embodiments is shown. In these figures, components that would be obscured from view by enclosure 203 or extension panels 234 are drawn with dashed outlines. In FIG. 2D, the server chassis 200 is illustrated in a configuration where the extension panels are in the first position, similar to that illustrated in FIG. 2B. In FIG. 2E, the server chassis 200 is illustrated in a configuration where the extension panels are in the second position, similar to that illustrated in FIG. 2C.

As seen in these figures, the fluid ports 232 may be connected to cooling modules 212 positioned in electronic area 210 with connectors 216. The connectors 216 may include tubes or other structures that place the fluid ports 232 in fluid communication with the cooling modules 212. The cooling modules 212 may be positioned with server boards 214 to cool them using cooling fluid obtained through the fluid ports 232. For example, while the fluid ports 232 are attached to cooling fluid distribution components cooling fluid may be circulated through the cooling modules 212 via the fluid ports 232 and connectors 216.

Additionally, as seen in FIG. 2D, the fluid ports 232 may be surrounded (e.g., above, below, and from multiple sides) by the extension panels 234 while the extension panels 234 are extended. By surrounding the fluid ports 232, the fluid ports 232 may be less likely to be damaged (e.g., by preventing other structures from making contact with the fluid ports 232). Once the extension panels are retracted, as seen in FIG. 2E, the fluid ports 232 may be physically exposed thereby allowing for easy fluid connections to be made to other components. The extension panel can be understood as providing a contained protection of the connectors.

Server board 214 which may be positioned in electronics area 210. The server board may include, for example, a circuit card and one or more components (e.g., processors, communications chips, power devices, etc.) positioned on the circuit card. The cooling module may cool one or more of these components. While illustrated in FIGS. 2D and 2E with a block, cooling module 212 may include any number of discrete cooling components (e.g., liquid cooling blocks) positioned with respective components. The discrete cooling components may be in fluid communication with each other and/or fluid ports 232 to facilitate cooling fluid circulation through the discrete cooling components.

Figure 2F:
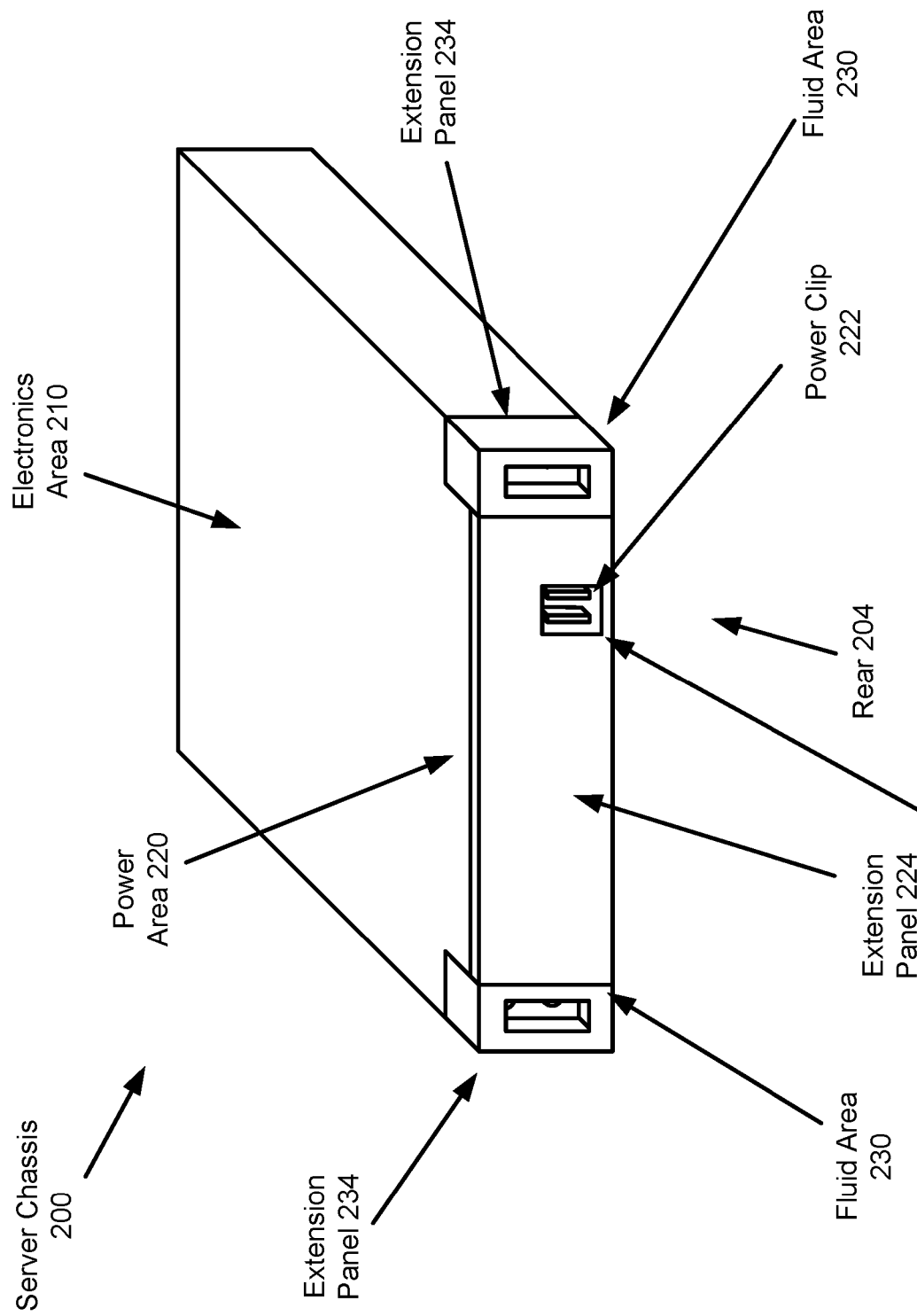
FIG. 2F shows a fourth diagram of a server chassis according to one embodiment.

Turning to FIG. 2F, a diagram of server chassis 200 in accordance with one or more embodiments is shown. The server chassis 200 may be similar to that shown in FIGS. 2A-2E, but may include an extension panel 224 on a rear 204 of enclosure 203.

Figure 2G:
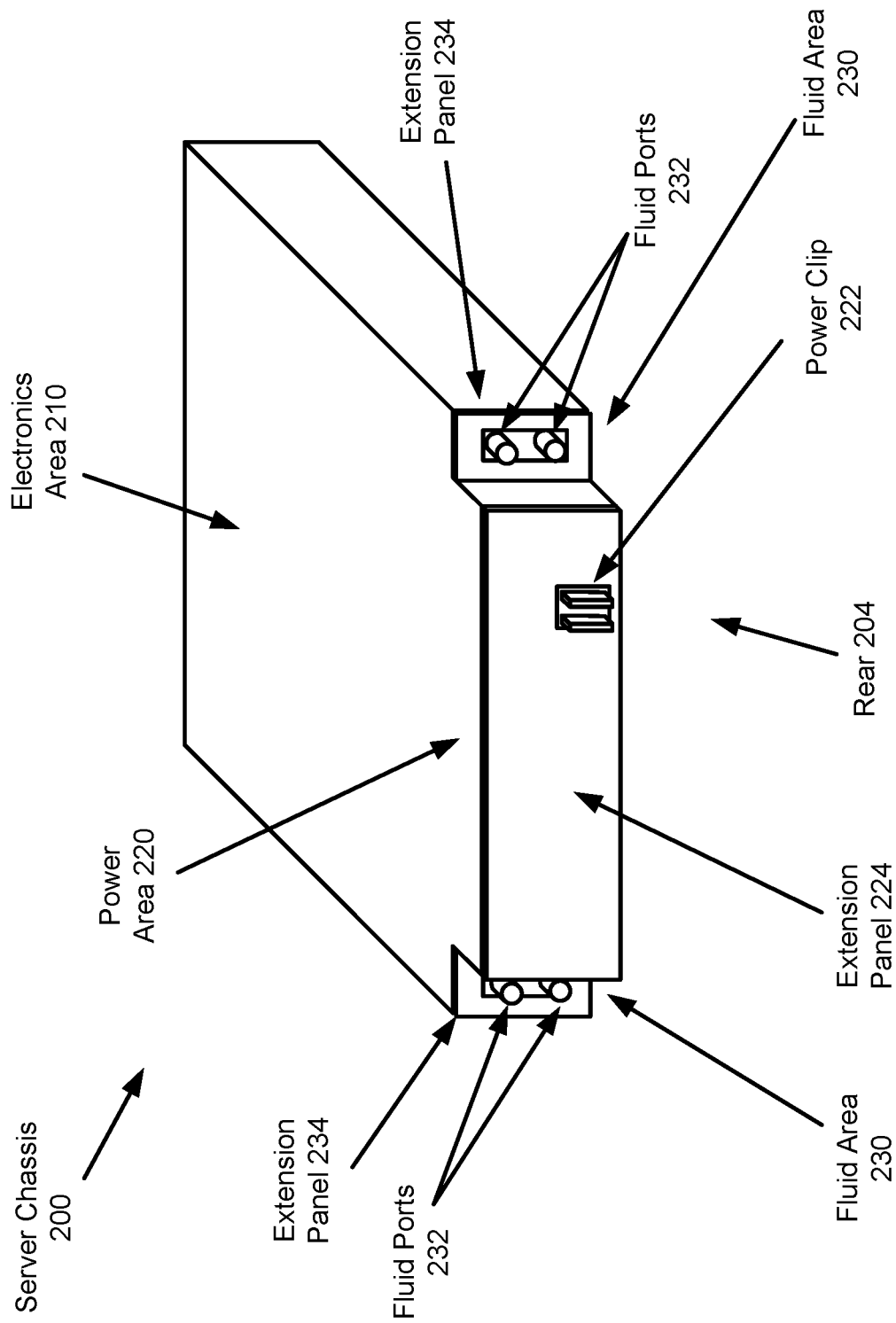
FIG. 2G shows a fifth diagram of a server chassis according to one embodiment.

As seen in FIG. 2F, server chassis 200 may include structures for protecting power clips 222 while the server chassis 200 is not positioned in an electronic rack. The structures may include extension panels 224. The extension panels 224 may include physical structures that cover the power clips 222 while the extension panels 234 are in a first position and expose the power clips 222 while the extension panels 234 are in a second position. In FIG. 2F, the extension panels 234 are illustrated in a first position. In FIG. 2G, the extension panels 234 are illustrated in a second position.

The extension panels 234 may include one or more openings 225 proximate to a rear 204 of the enclosure 203. The openings 225 may allow for the extension panels 224 to transition between the first and second positions without contacting the power clips 222.

The extension panels 224 may be adapted to preferentially move to the first position to cover the power clips. For example, the extension panels 224 may be attached to the enclosure 203 with sliding rails (or other structures for guiding the extension panels 224) and retention mechanisms (e.g., return springs or other mechanisms) to move the extension panels 224 to the first position unless load is applied to overcome force applied by the retention mechanisms. In some embodiments, the extension panels 224 include locking mechanisms to lock the extension panels 224 in the first position or the second position. For example, the extension panels 224 may include bolts, nuts, or other mechanical means for locking the extension panel 224 with respect to the enclosure 203 thereby keeping the power clips covered or exposed.

Turning to FIG. 2G, a diagram of server chassis 200 in accordance with one or more embodiments is shown. In FIG. 2G, the extension panels 224 are illustrated in a second position in which the power clips 222 are exposed. In this position, the power clips 222 may be able to make electrical connections to other components such as a busbar positioned in a distribution area while the server chassis 200 is positioned in an electronic rack. For example, as seen in FIG. 2F, the power clips 222 may be covered by the extension panels 224 on four sides while the extension panels 224 are in the first position (the power clips 222 may also be partially or not at all covered on a fifth side by the extension panel 234 by virtue of the openings 225). In contrast, the power clips 222 may be exposed on these sides while the extension panels 224 are in the second position. In this configuration, the fluid ports 232 may be able to be attached to other components such as cooling fluid distribution components.

Figure 2H:
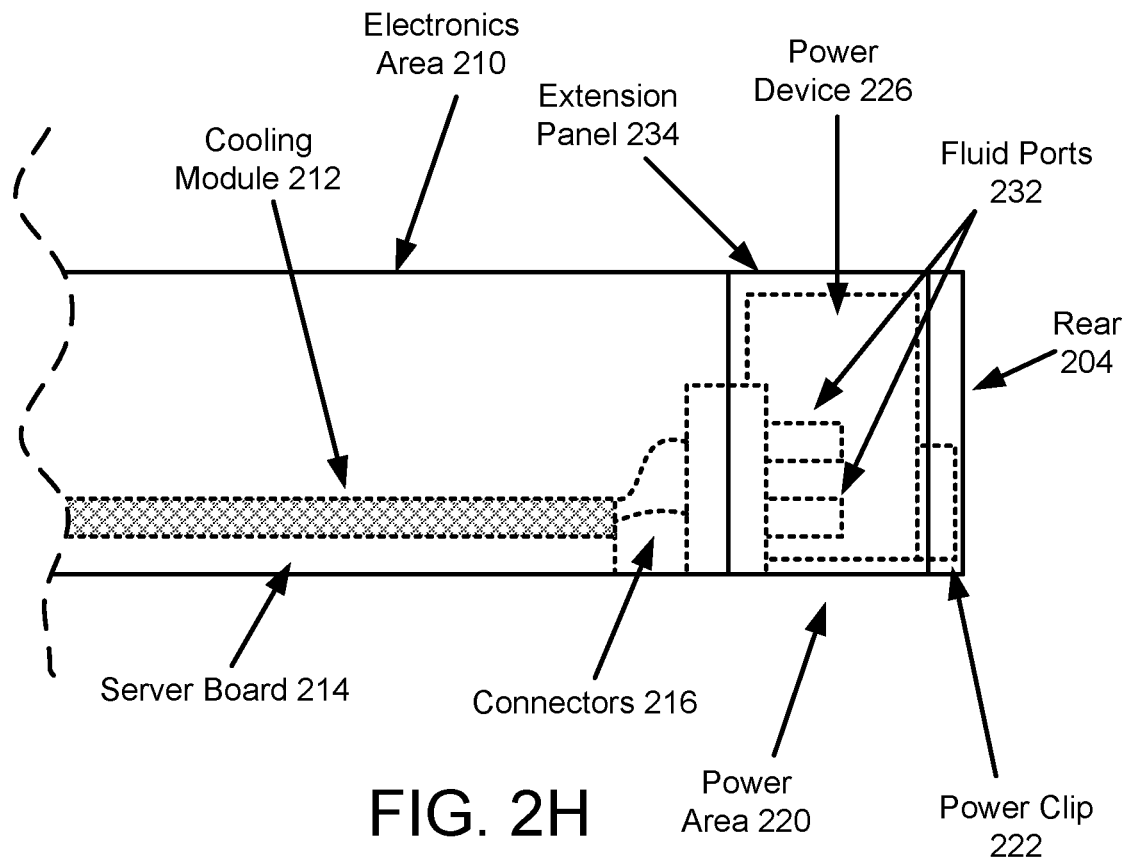
FIG. 2H shows a third side view diagram of a server chassis according to one embodiment.
Figure 2I:
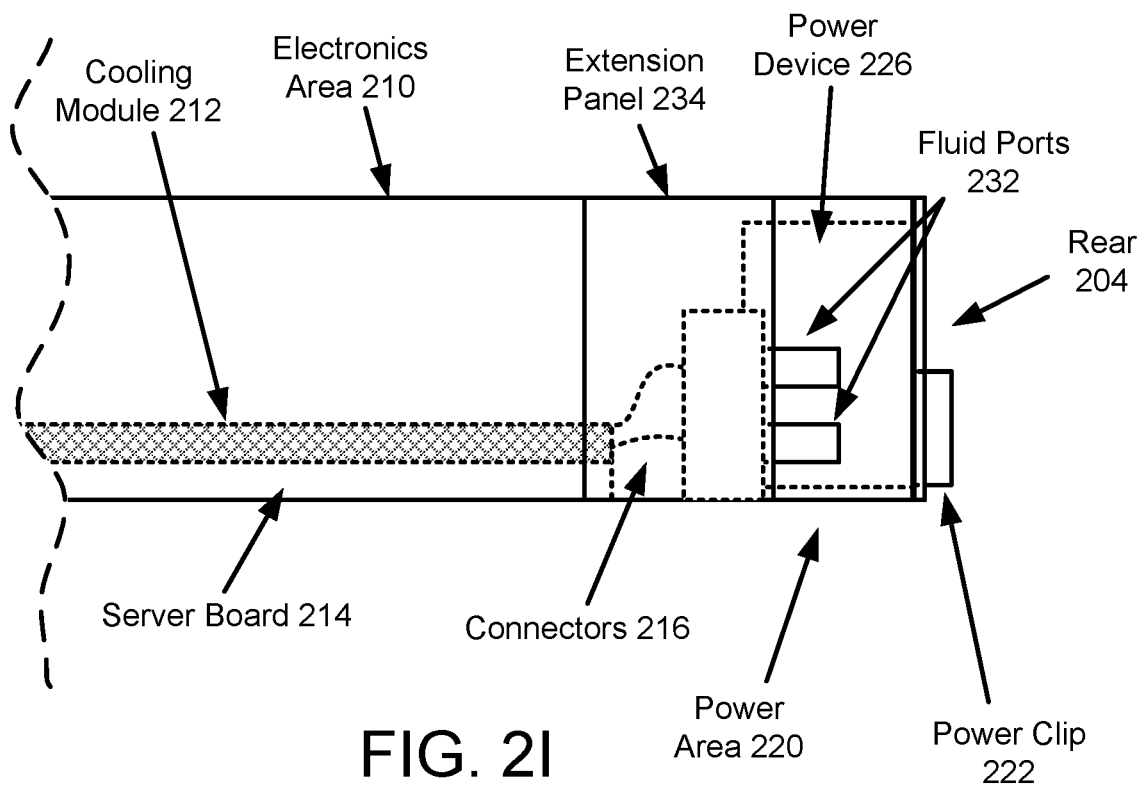
FIG. 2I shows a fourth side view diagram of a server chassis according to one embodiment.

Turning to FIGS. 2H and 2I, side view diagrams of server chassis 200 in accordance with one or more embodiments is shown. In these figures, components that would be obscured from view by enclosure 203, extension panels 224, or extension panels 234 are drawn with dashed outlines. In FIG. 2H, the server chassis 200 is illustrated in a configuration where all of the extension panels 224, 234 are in the first position, similar to that illustrated in FIG. 2F. In FIG. 2I, the server chassis 200 is illustrated in a configuration where all of the extension panels are in the second position, similar to that illustrated in FIG. 2G.

As seen in these figures, the fluid ports 232 may be connected to cooling modules 212 positioned in electronic area 210 with connectors 216. The connectors 216 may include tubes or other structures that place the fluid ports 232 in fluid communication with the cooling modules 212. The cooling modules 212 may be positioned with server boards 214 to cool them using cooling fluid obtained through the fluid ports 232. For example, while the fluid ports 232 are attached to cooling fluid distribution components cooling fluid may be circulated through the cooling modules 212 via the fluid ports 232 and connectors 216.

A power device 226 may also be positioned proximate to the power clip 222 in a power area. Like the fluid ports 232 and connectors 216, the power device 226 may be operably connected to the server boards 214 with wires (not shown) or other structures to provide it with power.

As seen in FIG. 2H, the fluid ports 232 and power clips 222 may be surrounded (e.g., above, below, and from multiple sides) by the extension panels 224, 234 while the extension panels 224, 234 are extended. By surrounding the power clip 222 and fluid ports 232, these components may be less likely to be damaged (e.g., by preventing other structures from making contact with them). Once the extension panels 224, 234 are retracted, as seen in FIG. 2I, the fluid ports 232 and power clip 222 may be physically exposed thereby allowing for easy fluid connections to be made to other components as well as electrical connections to be made to other components. The design may require some structural level codesign of the rack and server to enable the auto-retraction of the extension panels. And to enable the fluid to be engaged.

Additionally, as seen in FIG. 2H, the power device 226 may continue to be segregated by the enclosure from the fluid ports 232 even while the fluid ports 232 are exposed. Similarly, the power clip 222 may also be segregated from the fluid ports 232 by virtue of their respective placements (e.g., separated from one another by a portion of the enclosure 203). Consequently, these components may be less likely to interfere with one another even when a partial failure occurs such as a cooling fluid leak with the fluid ports 232.

Figure 3A:
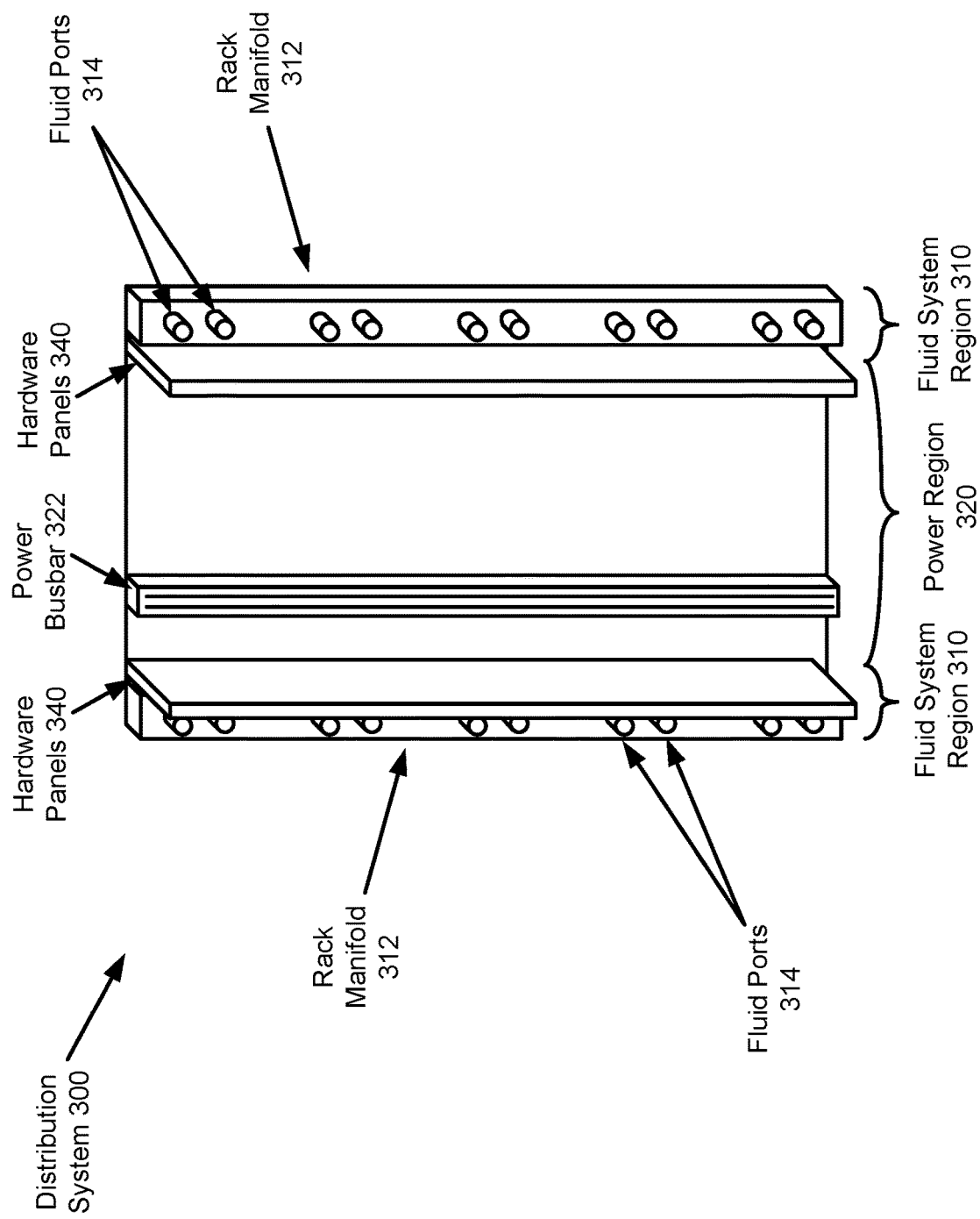
FIG. 3A shows a first diagram of a distribution system according to one embodiment.

Turning to FIG. 3A, a diagram of a distribution system 300 in accordance with one or more embodiments is shown.

The distribution system 300 may be usable to distribute cooling fluid and power to server chassis positioned in an electronic rack. The distribution system 300 may be positioned in a distribution area of an electronic rack prior to or after server chassis are positioned in the electronic rack. To provide its functionality, the distribution system 300 may include one or more rack manifolds 312, one or more power busbars 322, and one or more power busbars 322. Each of these components is discussed below.

The rack manifolds 312 may be physical structures for distributing cooling fluid. For example, the rack manifolds 312 may include tubes, manifolds, fluid ports 314, and/or other components usable to form fluid connections, loops, and/or fluid flow management structures.

The fluid ports 314 may be adapted to connect to fluid ports on server chassis and/or other components to be positioned in an electronic rack. For example, the fluid ports 314 may be positioned, oriented, shaped, and/or otherwise formed to facilitate the formation of fluid connections with fluid ports of server chassis. The fluid ports 314 may be positioned in complementary positions to the fluid ports on server chassis such that fluid connections between the rack manifold and a server chassis may be automatically made when the server chassis is positioned in the electronic rack. In some embodiments, the positioning, orientation, and/or other characteristics of the fluid ports 314 are adjustable to facilitate connection with fluid ports of server chassis.

Power busbar 322 may be a power distribution component capable of distributing direct current (or other types of electrical power) provided by a power supply unit (or other component) to other components such as server chassis and battery backup units (e.g., which each may also be operably connected to power busbar 322 when positioned in an electronic rack). Power busbar 322 may include any number of conductors positioned and oriented to form connections with power clips (e.g., of server chassis, battery backup units, etc.) when server chassis 200 is positioned in electronic rack 100. Power busbar 322 may also include a housing or other components to limit access to the conductors while facilitating connection of power clips to the conductors.

The hardware panels 340 may be physical structures for segregating components from one another in distribution area 125. For example, the hardware panels 340 may include plates having shapes usable to divide distribution area 125 (entirely or partially) into different regions that are segregated from one another. Some of these regions may be fluid system regions 310 and others may be power regions 320.

The fluid system regions 310 may be regions within the distribution area 125 reserved for cooling fluid distribution. For example, the fluid system regions 310 may be reserved for rack manifolds 312 and/or other type of cooling fluid distribution components.

The power regions 320 may be regions within the distribution area 125 reserved for power distribution. For example, the power region 320 may be reserved for power busbars 322 and/or other types of power distribution components.

The distribution system 300 may include any number and type of hardware panels 340 to form any number of regions segregated from one another. By segregating these regions from one another, operation of components within these regions may be less likely to be disrupted by the operation of other components.

In one embodiment, the hardware panels 340 are adapted to provide for segregation of the distribution region in collaboration with server chassis. For example, the hardware panels 340 may have shapes, may be positioned, may be oriented, and/or may have other characteristics complementary to the server chassis. For example, the hardware panels 340 may have depths (into the page in FIG. 3A), widths (from left to right across the page in FIG. 3A), and/or heights (from top to bottom of the page in FIG. 3A) corresponding to server chassis to divide the distribution area 125 into different regions that are segregated from one another. For example, the hardware panels 340 may have depths such that they extend from a rear of a server chassis to a back panel of an electronic rack.

While the hardware panels 340 are shown in FIG. 3A with specific shapes (e.g., a rectangular panel), the hardware panels 340 may have other shapes. For example, the depth of the hardware panels 340 may vary across their heights to correspond to the depths of different server chassis. In other examples, the hardware panels 340 may be formed with multiple subpanels corresponding to different server chassis or other components positioned in an electronic rack.

In some embodiments, the hardware panels, power busbar 322, and/or rack manifold 312 may be attached to each other with a back panel or other structure to form a modularized unit. In other embodiments, each of these components may be separate from one another and may be provided as a kit.

Figure 3B:
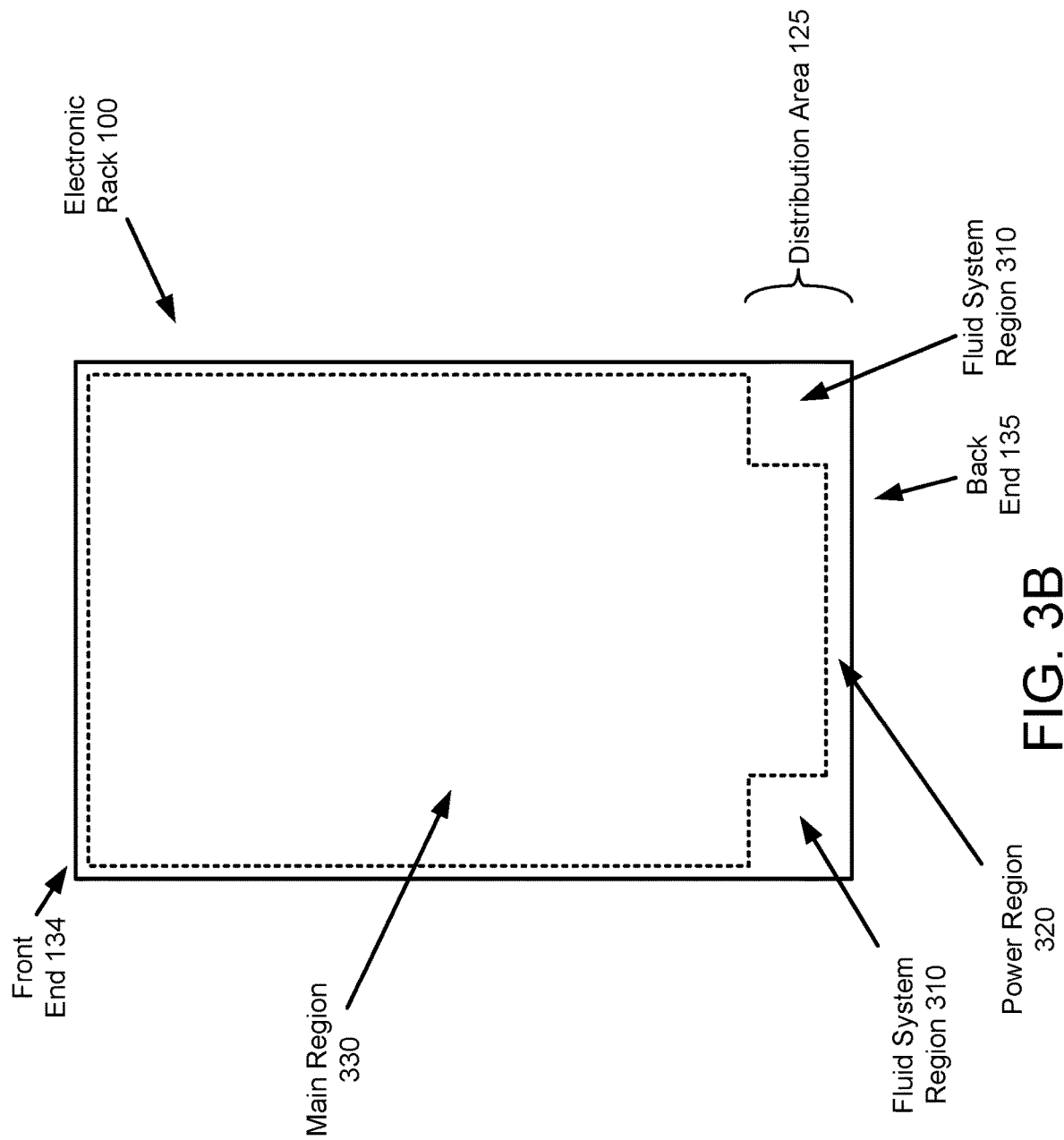
FIG. 3B shows a first top view diagram of an electronic rack according to one embodiment.

Turning to FIG. 3B, a top view diagram of electronic rack 100 in accordance with one or more embodiments is shown. An interior of the electronic rack 100 may be divided into a main region 330 (in which server chassis may be positioned), a power region 320 (in which power distribution components may be positioned), and fluid system regions 310 (in which cooling fluid distribution components may be positioned). An outline in dashing of a server chassis as may be positioned in the electronic rack 100 is shown. The internal design shown as dash line in FIG. 3b may include structure design and component to retract the extension panels.

The power region 320 and fluid system regions 310 may be proximate to a back end 135 of the electronic rack 100. When a server chassis is positioned in the electronic rack, fluid and power connection to components positioned in the fluid system region 310 and power region 320, respectively, may be formed.

From the back end 135, the fluid system region 310 may extend outward into the interior of the electronic rack 100 a greater distance than the power region 320 extends outward into the interior of the electronic rack. Consequently, the positions where leaks may be more likely to form (e.g., at the interface between fluid ports) may be physically separated from the power busbar in two different dimensions (e.g., across a width of the electronic rack and at different depths into the electronic rack).

Figure 3C:
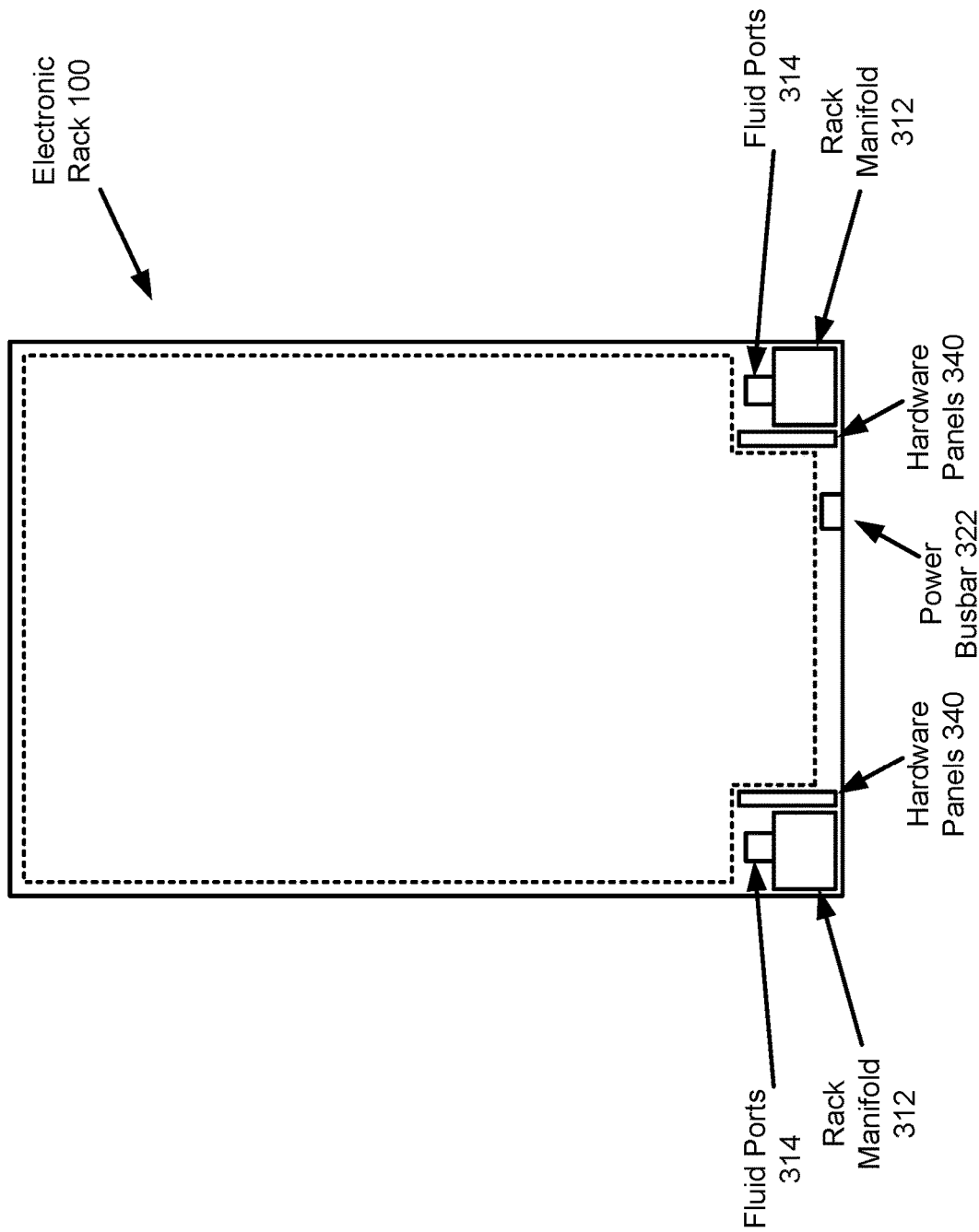
FIG. 3C shows a second top view diagram of an electronic rack according to one embodiment.
Figure 3D:
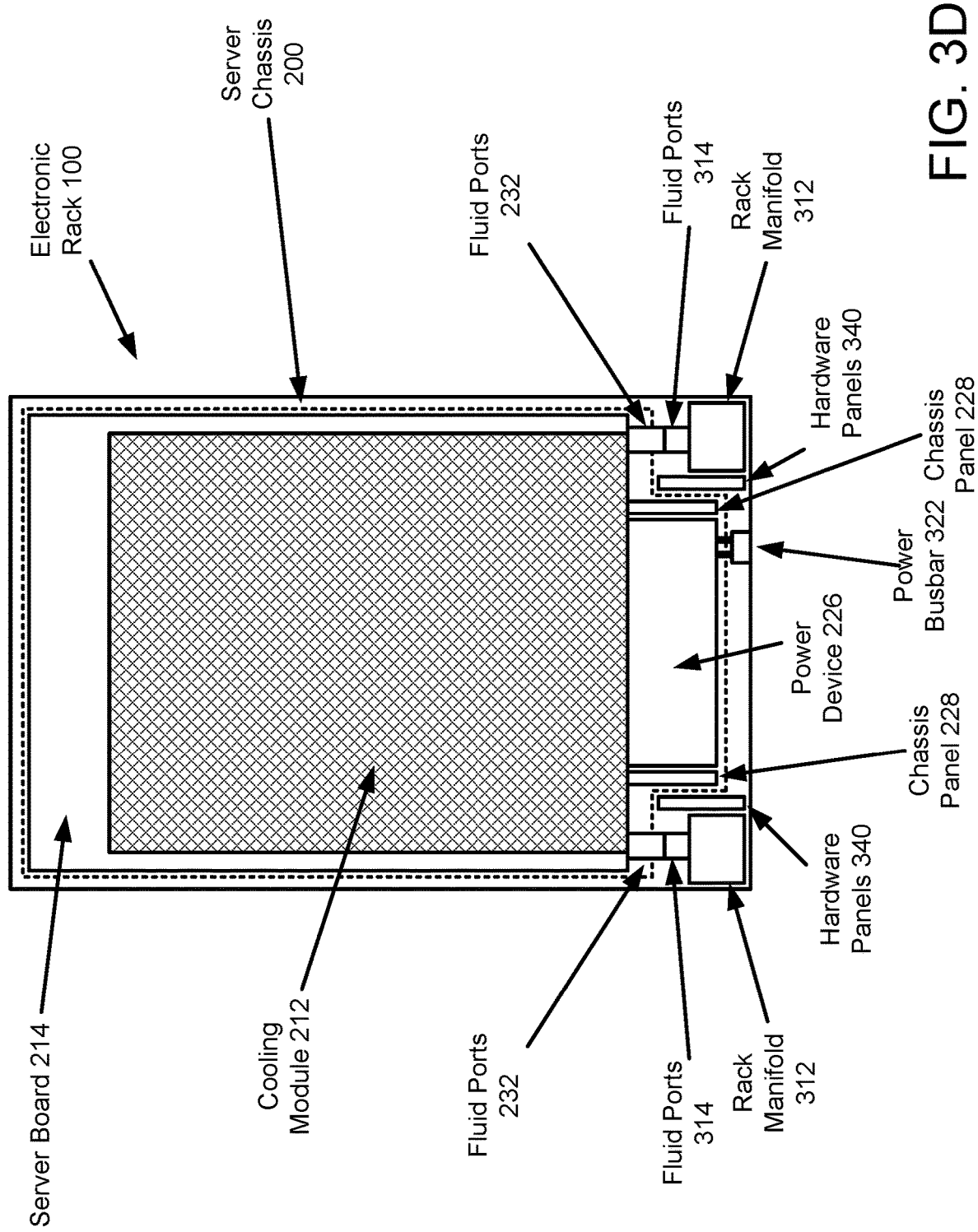
FIG. 3D shows a third top view diagram of an electronic rack according to one embodiment.
Figure 3E:
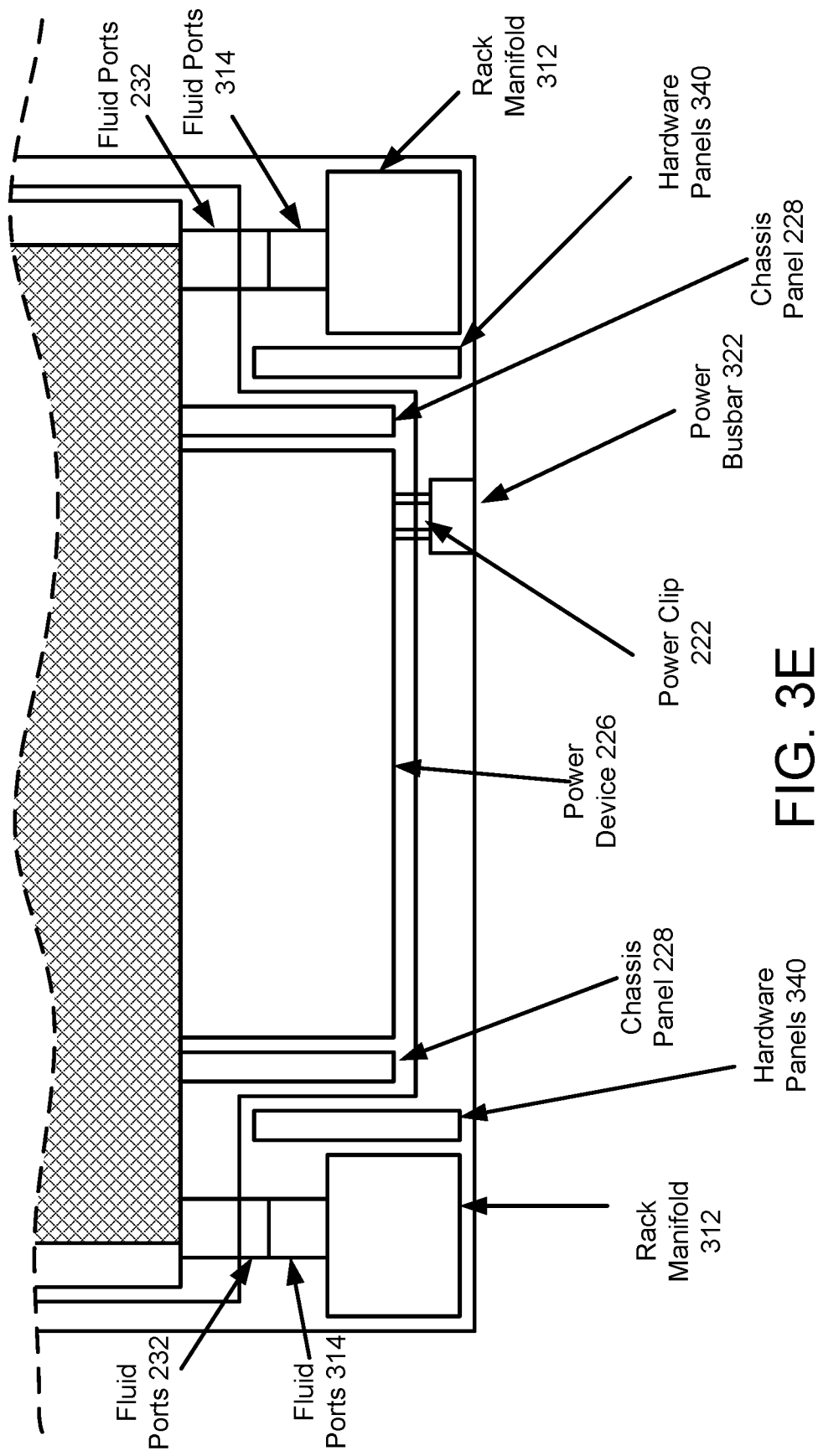
FIG. 3E shows a fourth top view diagram of an electronic rack according to one embodiment.

Turning to FIG. 3C, a top view diagram of electronic rack 100 in accordance with one or more embodiments is shown. As seen in FIG. 3C, the electronic rack 100 may include rack manifolds 312 positioned in the fluid system regions 310 and a power busbar 322 positioned in the power region 320. These regions may be segregated from each other with hardware panels 340. The hardware panels 340 may reduce the likelihood of cooling flood escaped from the rack manifolds 312 from shorting out or otherwise interfering with the operation of the power busbar 322. For example, the hardware panels 340 may prevent cooling fluid leaked from the rack manifolds 312 from entering the power region 320.

Turning to FIG. 3D, a top view diagram of electronic rack 100 in accordance with one or more embodiments is shown. An enlarged view of the top view diagram of FIG. 3D is also shown in FIG. 3E. As seen in FIG. 3D, the electronic rack 100 may include rack manifolds 312 positioned in the fluid system regions 310, a power busbar 322 positioned in the power region 320, and a server chassis 200 positioned in the electronic rack 100.

While the server chassis 200 is positioned in the main region of electronic rack 100, the fluid ports 232 of the server chassis 200 may be connected to fluid ports 314 of the rack manifolds 312. These fluid connections may allow cooling fluid to be circulated to cooling module 212 (illustrated with hatch fill) thereby cooling server board 214. While cooling module 212 is illustrated in FIG. 3D with a rectangular block, it should be appreciated that cooling module 212 may be implemented with any number of discrete cooling elements in fluid communication with each other and/or some of the fluid ports to allow cooling fluid to circulate through each of the discrete cooling elements.

As seen in FIG. 3D, power device 226 may generally be positioned on one side of the server board 214 along with the fluid ports 232. The power device 226 may be positioned between the fluid ports 232. One or more chassis panels 228 may be positioned between the power device 226 and the fluid ports 232 to segregate these components from each other.

Like the chassis panels 228 for the server chassis 200, the hardware panels 340 may also segregate different regions of the electronic rack 100. For example, as seen in FIG. 3D, the hardware panels 340 may segregate the rack manifolds 312 from the power busbar 322.

Figure 3F:
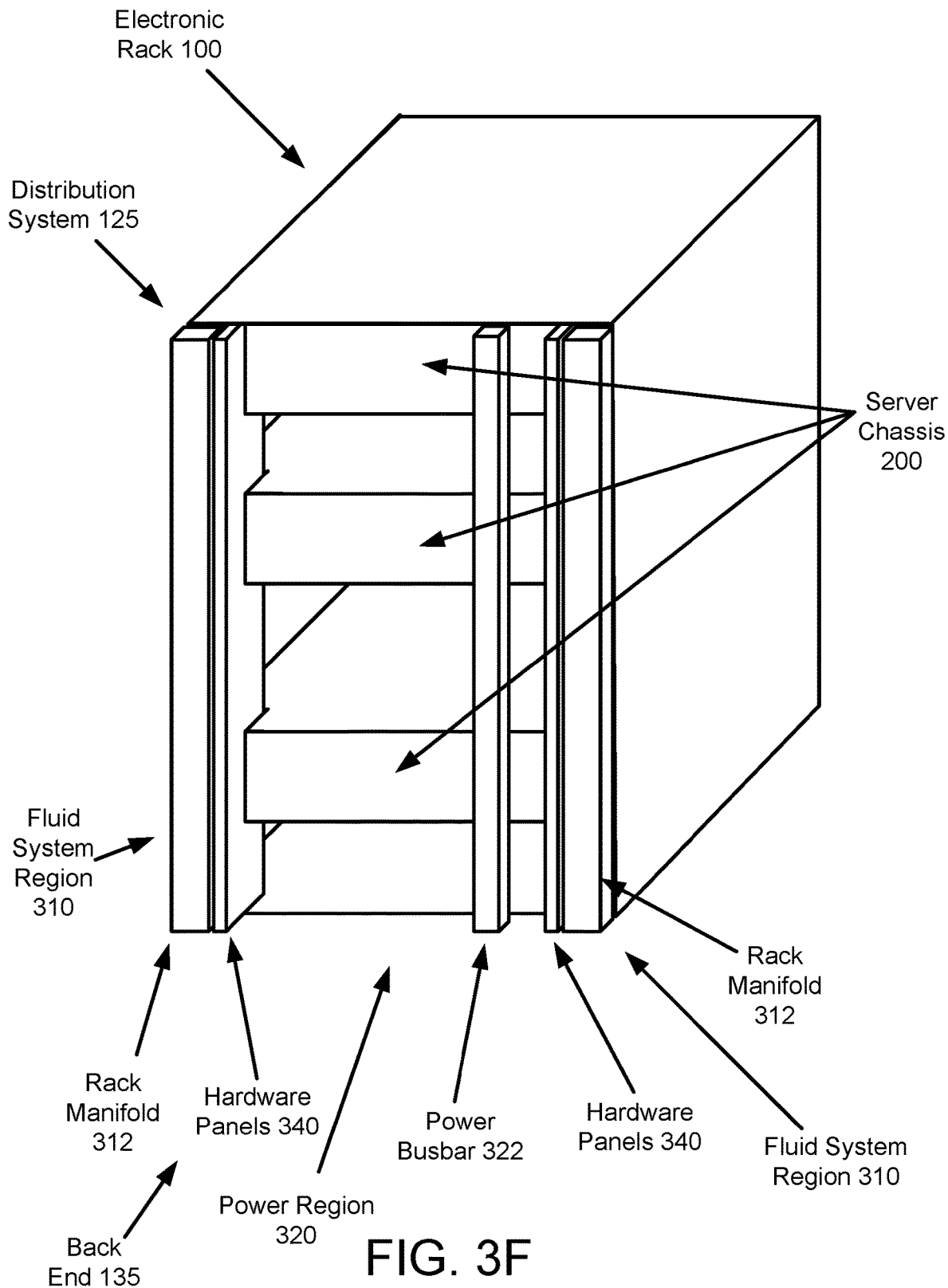
FIG. 3F shows a second diagram of an electronic rack according to one embodiment.

Turning to FIG. 3F, a diagram of electronic rack 100 in accordance with one or more embodiments is shown. In FIG. 3B, view towards a back end 135 of electronic rack 100 is shown. In the figure, a rear panel and/or other structures along a rear of the electronic rack 100 are not shown. Other structures may be present on the back end 135 of the electronic rack without departing from embodiments disclosed herein.

Any number of server chassis 200 may be positioned in electronic rack 100. When positioned in electronic rack 100, the server chassis 200 may be fluidly connected to rack manifolds 312 and power busbar 322. The rack manifolds 312 may be segregated from the power busbar 322 with hardware panels 340.

To be placed into the state as illustrated in FIG. 3F, both the server chassis 200 and other components may need to be moved into the electronic rack 100. Such a maneuver may require alignment of the power clips and fluid ports of the server chassis with power busbars and fluid ports of rack manifolds. If these components are not aligned, connections may not be properly made between these components which may result, for example, in cooling fluid escaping and/or power failing to be properly distributed to the server chassis.

To reduce the likelihood of improper alignment of these components, the server chassis 200 may include protective features to reduce the likelihood of these components from being damaged and various components may be added to electronic racks in various orders.

Figure 4A:
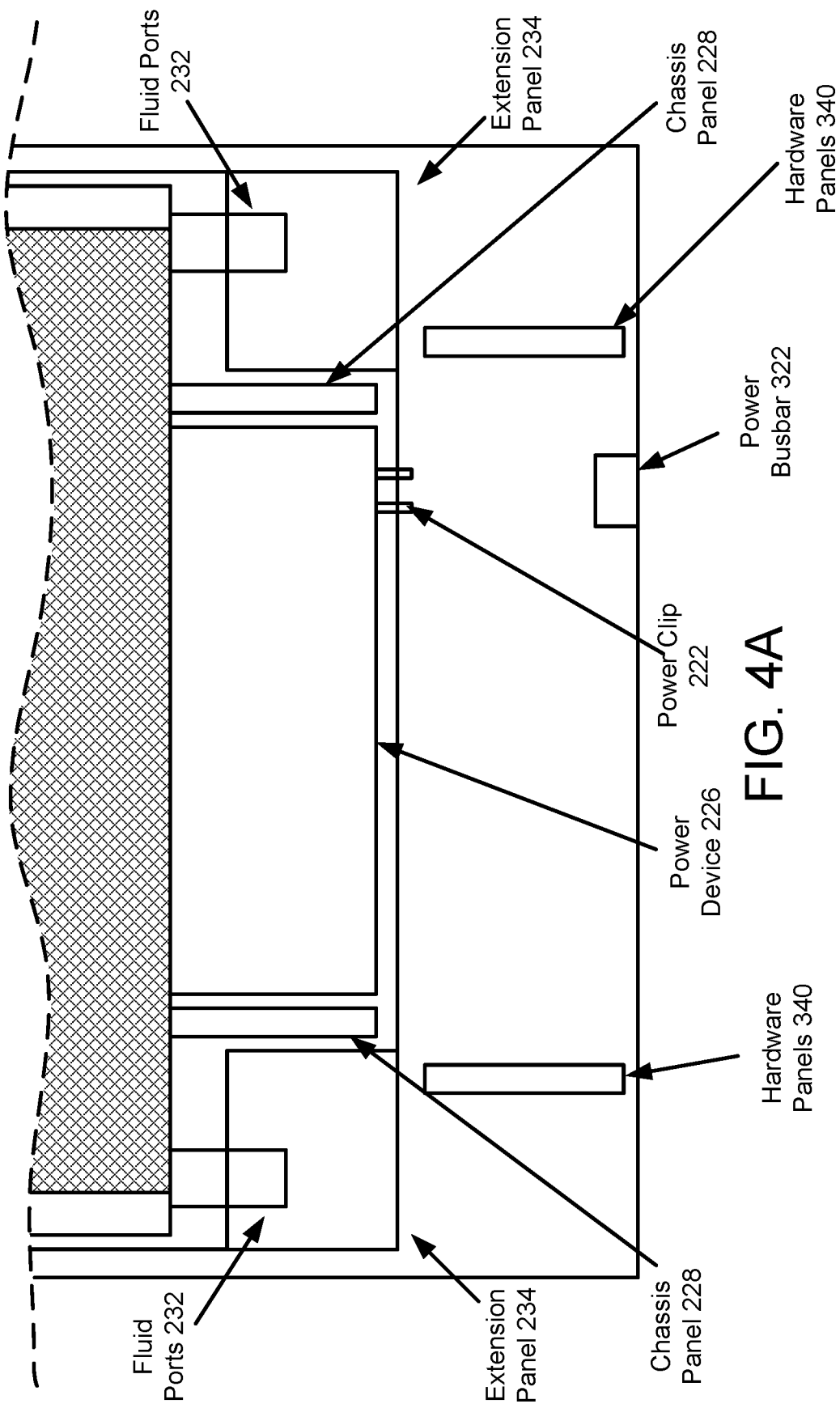
FIG. 4A shows a fifth top view diagram of an electronic rack according to one embodiment.
Figure 4B:
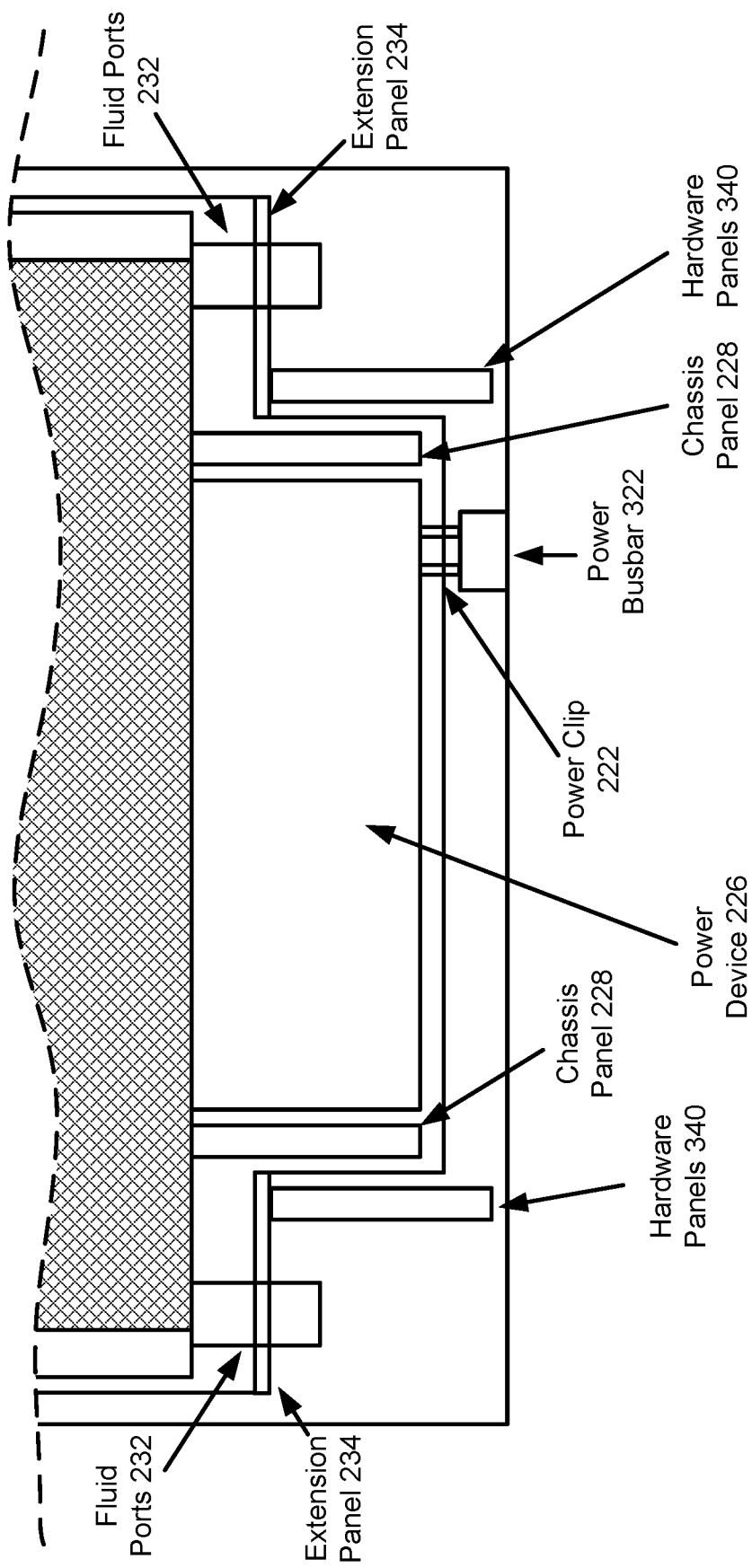
FIG. 4B shows a sixth top view diagram of an electronic rack according to one embodiment.
Figure 4C:
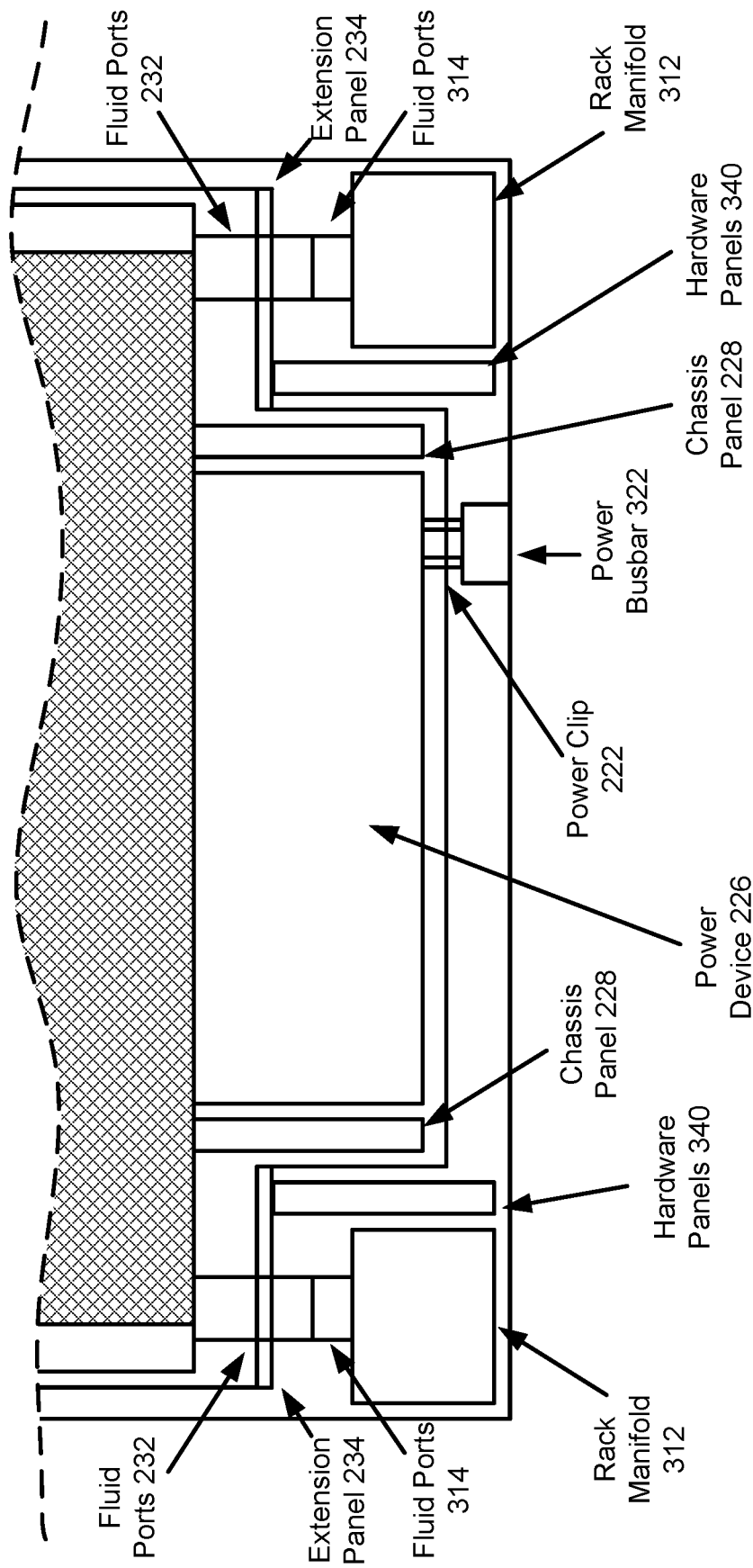
FIG. 4C shows a seventh top view diagram of an electronic rack according to one embodiment.

Turning to FIGS. 4A-4C, an electronic rack 100 in accordance with one or more embodiments is shown. Specifically, these figures may illustrate an example scenario in which a server chassis includes protective features for its fluid ports 232 and rack manifolds are installed after the server chassis is installed in the electronic rack.

As seen in FIG. 4A, when a server chassis is being inserted into (and prior to insertion) an electronic rack, extension panels 234 may be in an extended state thereby protecting fluid ports 232 from being impacted by other components which may damage the fluid ports 232 (e.g., by changing their shape, alignment, and/or positioning). When the server chassis is positioned in the electronic rack, as seen in FIG. 4B, the extension panels 234 may be retracted to expose the fluid ports 232. A power clip 222 may be placed into direct contact with power busbar 322 thereby facilitating the flow of electric power to server boards inside of the server chassis.

After the server chassis is positioned in the electronic rack 100, then, a seen in FIG. 4C, the rack manifolds 312 may be installed. Once installed, the fluid ports 232 of the server chassis 200 may be fluidly connected to the fluid ports 314 of the rack manifolds 312. Consequently, cooling fluid may begin to circulate to the cooling modules.

Figure 5A:
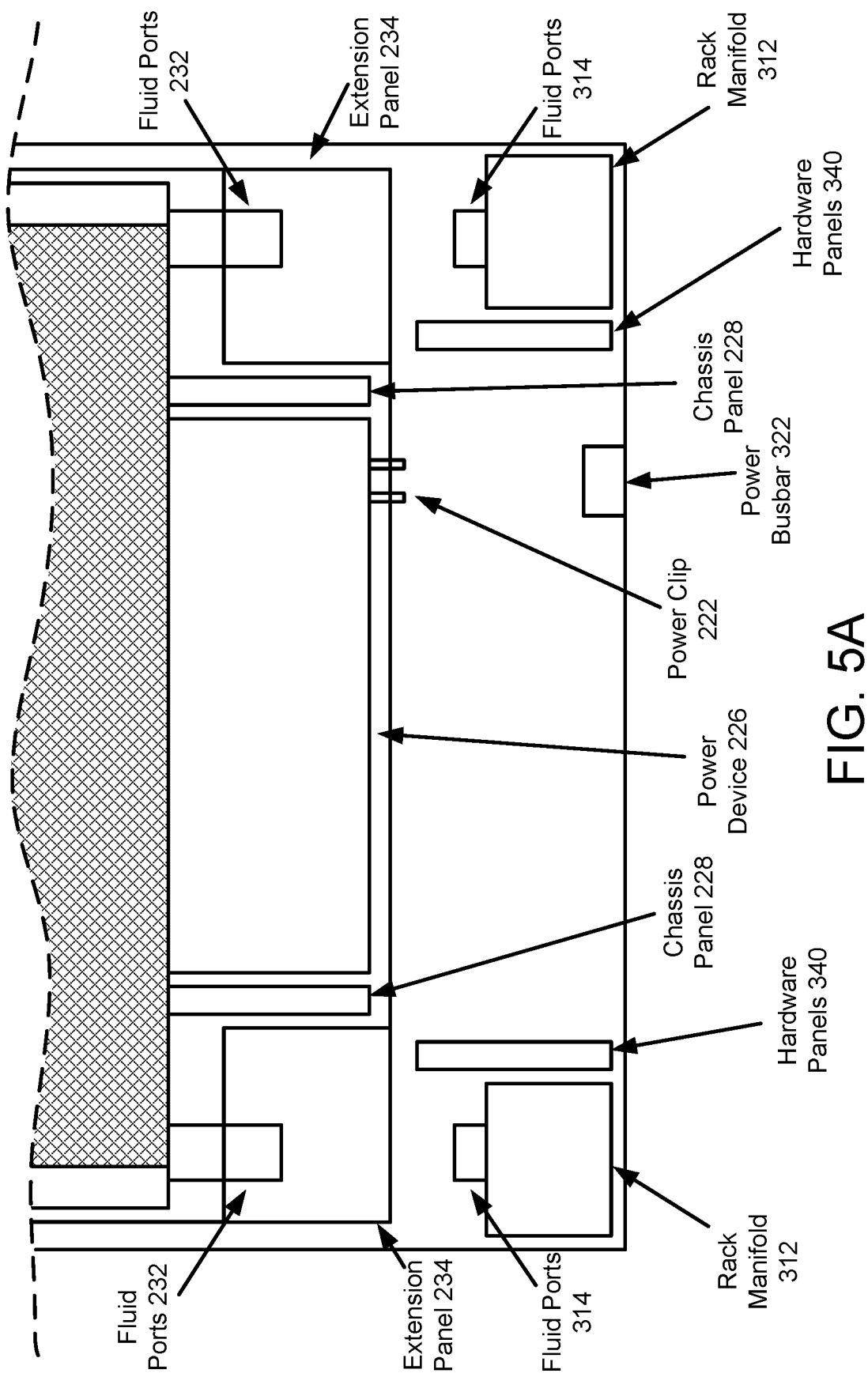
FIG. 5A shows an eighth top view diagram of an electronic rack according to one embodiment.
Figure 5B:
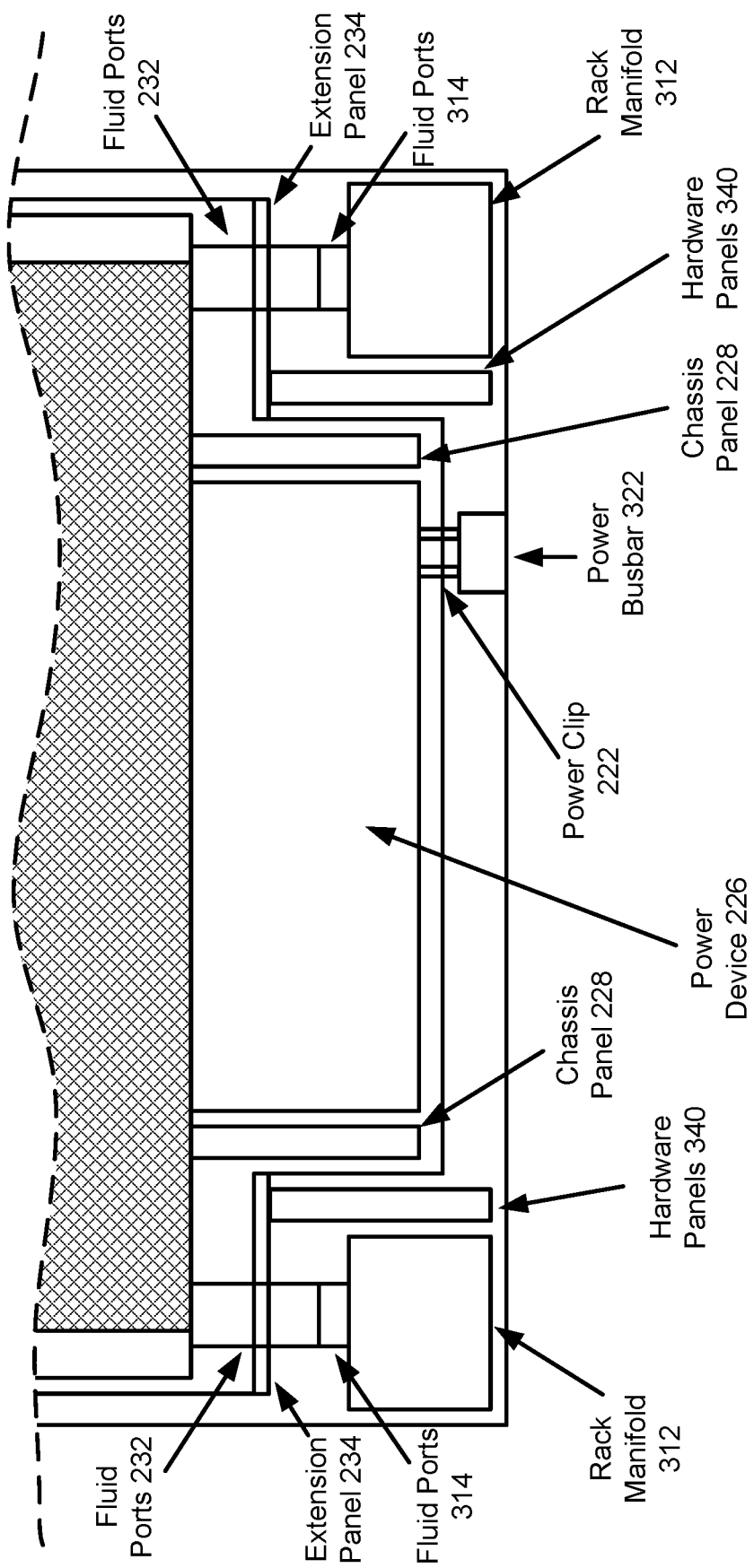
FIG. 5B shows a ninth top view diagram of an electronic rack according to one embodiment.

Turning to FIGS. 5A-5B, an electronic rack 100 in accordance with one or more embodiments is shown. Specifically, these figures may illustrate an example scenario in which a server chassis includes protective features for its fluid ports 232 and rack manifolds are installed prior to when the server chassis is installed in the electronic rack.

As seen in FIG. 5A, when a server chassis is being inserted into (and prior to insertion) an electronic rack, extension panels 234 may be in an extended state thereby protecting fluid ports 232 from being impacted by other components which may damage the fluid ports 232 (e.g., by changing their shape, alignment, and/or positioning). When the server chassis is positioned in the electronic rack, as seen in FIG. 5B, the extension panels 234 may be retracted to expose the fluid ports 232 which make a fluid connection to the fluid ports 314 of the rack manifold thereby beginning circulation of cooling fluid to cooling modules in the server chassis 200. A power clip 222 may also be placed into direct contact with power busbar 322 thereby facilitating the flow of electric power to server boards inside of the server chassis 200.

Figure 6A:
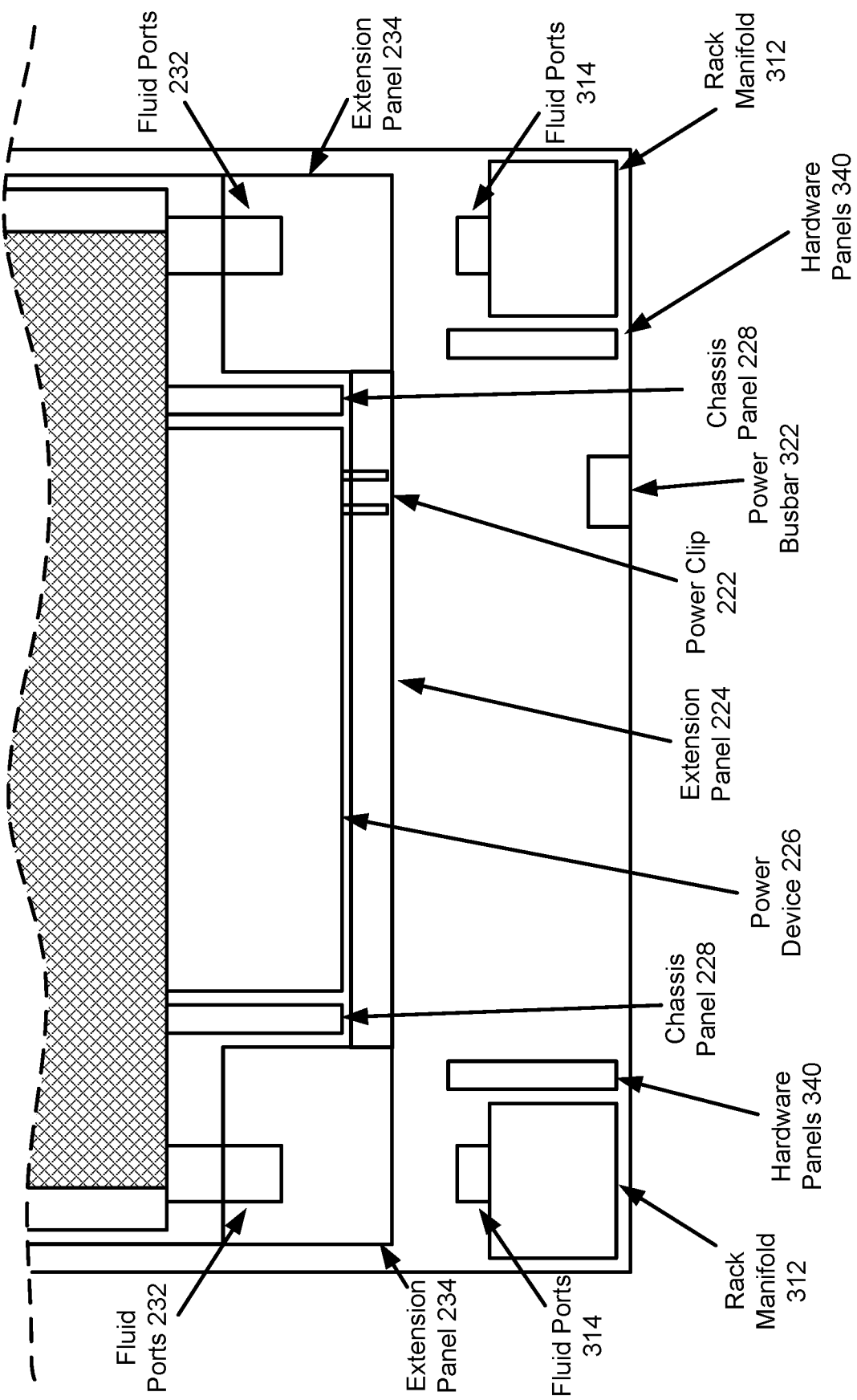
FIG. 6A shows a tenth top view diagram of an electronic rack according to one embodiment.
Figure 6B:
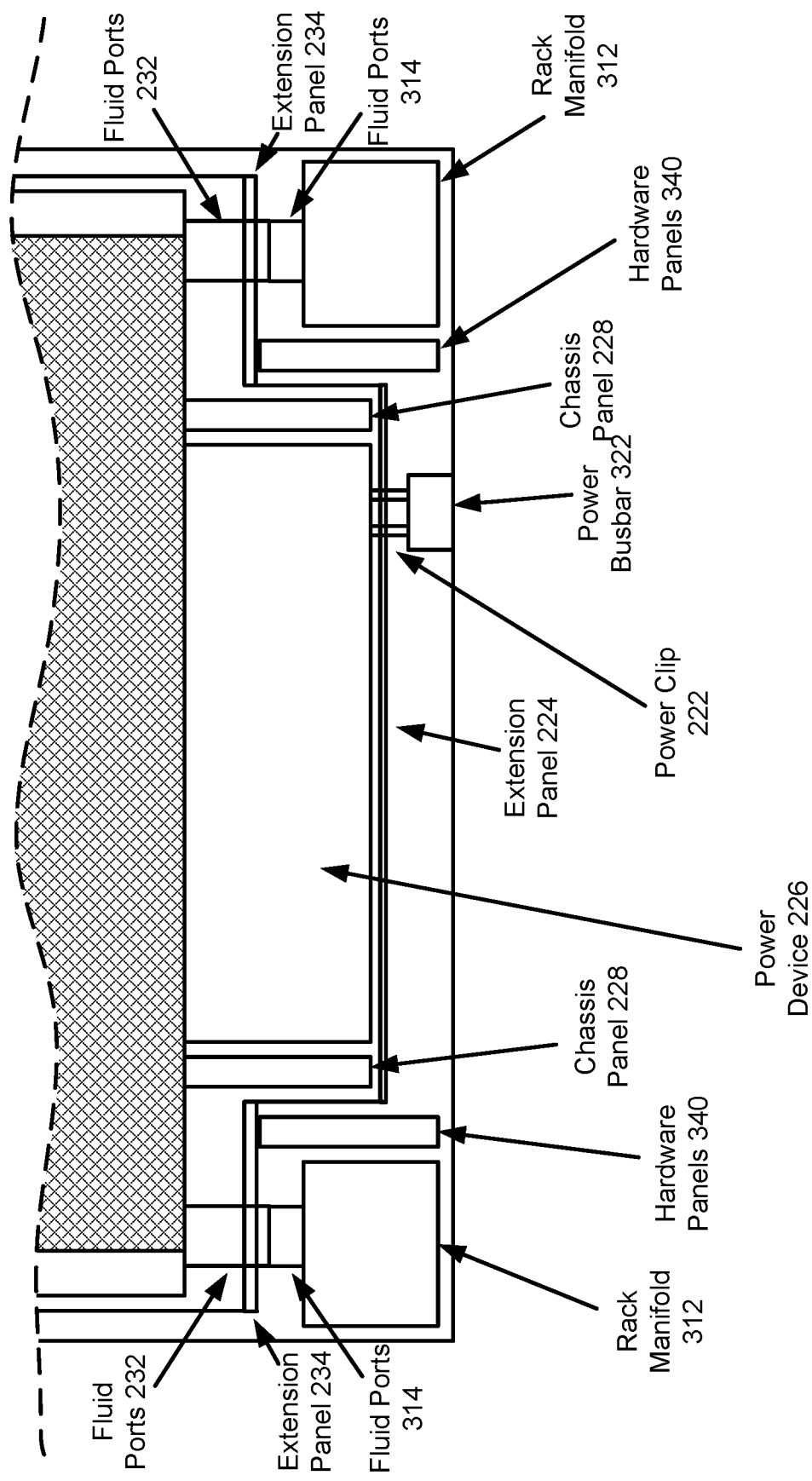
FIG. 6B shows an eleventh top view diagram of an electronic rack according to one embodiment.

Turning to FIGS. 6A-6B, an electronic rack 100 in accordance with one or more embodiments is shown. Specifically, these figures may illustrate an example scenario in which a server chassis includes protective features for its fluid ports 232 and power clip 222, and rack manifolds are installed prior to when the server chassis is installed in the electronic rack.

As seen in FIG. 6A, when a server chassis is being inserted into (and prior to insertion) an electronic rack, extension panels 234 may be in an extended state thereby protecting fluid ports 232 from being impacted by other components which may damage the fluid ports 232 (e.g., by changing their shape, alignment, and/or positioning). Similarly, extension panels 224 may also be in an extended state thereby protecting power clip 222 from being impacted by other components which may damage the power clip 222 (e.g., by changing their shape, alignment, and/or positioning).

When the server chassis is positioned in the electronic rack, as seen in FIG. 6B, the extension panels 234 may be retracted to expose the fluid ports 232 which make a fluid connection to the fluid ports 314 of the rack manifold thereby beginning circulation of cooling fluid to cooling modules in the server chassis 200. Similarly, the extension panels 224 may be retracted to expose the power clip 222 which makes contact with power busbar 322 thereby facilitating the flow of electric power to server boards inside of the server chassis 200.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:
   a main region;
   a plurality of server chassis arranged in a stack in the main region, at least one of the server chassis comprising:
      fluid ports to receive cooling fluid,
      a power clip to receive power,
      a first structure comprising an extension panel, the extension panel adapted to: protect the fluid ports from damage by surrounding the fluid ports except on a rear side while the at least one of the server chassis is not positioned in a main region, and expose the fluid ports while the at least one of the server chassis is positioned in the main region by retracting the extension panel,
   two fluid system regions for distributing the cooling fluid to the plurality of server chassis, wherein each of the two fluid system regions include two or more fluid ports for distributing the cooling fluid to the at least one of the server chassis; a power region segregated from the two fluid system regions, the power region for distributing power to the at least one of the server chassis with the power clip; and hardware panels positioned between the two fluid system regions and the power region, wherein the hardware panels extend parallel to the fluid ports of the two fluid system regions, segregate the two fluid system regions from the power region, and configured to cause the extension panel to retract during installation of the at least one of the server chassis into the electronic rack.

2. The electronic rack of claim 1, wherein the at least one of the server chassis further comprises:
   a cooling module positioned to cool, with the cooling fluid, a server board, the cooling module is in fluid communication with the fluid ports.

3. The electronic rack of claim 1, wherein the at least one of the server chassis further comprises: a second structure positioned to protect the power clip from damage while the at least one of the server chassis is not positioned in the main region, wherein the second structure is adapted to: physically expose the power clip while the at least one of the server chassis is positioned in the main region, and partially cover the power clip while the at least one of the server chassis is positioned outside of the main region.

4. The electronic rack of claim 1, wherein the first structure protects the fluid ports by partially containing the fluid ports except on a rear side while the at least one of the server chassis is positioned outside of the main region; and the first structure exposes the fluid ports by retracting the extension panel to connect the fluid ports to a cooling fluid distribution system positioned in the two fluid system regions while the at least one of the server chassis is positioned in the main region.

5. The electronic rack of claim 1, wherein the first structure comprises the extension panel to move between a first position and a second position, the extension panel being retracted in the second position to physically expose the fluid ports, and the extension panel being extended in the first position to partially contain the fluid ports.

6. The electronic rack of claim 1, wherein the at least one of the server chassis further comprises:
   an electronics area for housing:
      a server board, and
      a cooling module in fluid communication with the fluid ports; and
   a power area for housing a power device operably connected to the power clip to receive the power,
   wherein the first structure comprises a pair of extension panels positioned with a rear side of the at least one of the server chassis, the pair of extension panels positioned on opposite sides of the power area and segregated from the power area, and all of the pair of extension panels and the power area positioned on one side of the electronics area.

7. The electronic rack of claim 1, further comprising: a first rack manifold positioned in a first fluid system region of the two fluid system regions for fluid communication with the fluid ports while the at least one of the server chassis is positioned in the main region; and a second rack manifold positioned in a second fluid system region of the two fluid system regions for the fluid communication with the fluid ports while the at least one of the server chassis is positioned in the main region.

8. The electronic rack of claim 7, wherein the two fluid system regions are positioned along a rear of the electronic rack and the two fluid system regions are separated from each other by the power region, wherein the two fluid system regions are adapted to receive fluid distribution systems to distribute the cooling fluid.

9. The electronic rack of claim 1, further comprising: a fluid distribution system positioned in one of the two fluid system regions, wherein the fluid distribution system is fluidly connected to the fluid ports by moving the first structure to a retracted position that exposes the fluid ports, the first structure being moved to the retracted position by applying pressure to the first structure during installation of the at least one of the server chassis into the electronic rack.

10. A data center system, comprising:
    an electronic rack comprising:
       a main region;
       a plurality of server chassis arranged in a stack in the main region, at least one of the server chassis comprising:
          fluid ports to receive cooling fluid,
          a power clip to receive power,
          a first structure comprising an extension panel, the extension panel adapted to: protect the fluid ports from damage by surrounding the fluid ports except on a rear side while the at least one of the server chassis is not positioned in a main region of the electronic rack, expose the fluid ports while the at least one of the server chassis is positioned in the main region by retracting the extension panel, and one or more cooling modules associated with one or more server boards, the one or more cooling modules in fluid communication with the fluid ports;
       two fluid system regions for distributing the cooling fluid to the plurality of server chassis, wherein each of the two fluid system regions include two or more fluid ports for distributing the cooling fluid to the at least one of the server chassis; a power region segregated from the two fluid system regions and for distributing power to the at least one of the server chassis with the power clip; and hardware panels positioned between the two fluid system regions and the power region, wherein the hardware panels extend parallel to the fluid ports of the two fluid system regions, segregate the two fluid system regions from the power region, and are configured to cause the extension panel to retract during installation of the at least one of the server chassis into the electronic rack.

11. The data center system of claim 10, wherein one or more IT components in the at least one of the server chassis are operably connected to other IT components housed in other server chassis, the one or more IT components and the other IT components forming a computing environment that provides computer implemented services.

12. The data center system of claim 10, wherein the at least one of the server chassis further comprises: a second structure positioned to protect the power clip from damage while the at least one of the server chassis is not positioned in the main region, wherein the second structure is adapted to: physically expose the power clip while the at least one of the server chassis is positioned in the main region, and partially cover the power clip while the at least one of the server chassis is positioned outside of the main region.

13. The data center system of claim 10, wherein the first structure protects the fluid ports by partially containing the fluid ports except on a rear side while the at least one of the server chassis is positioned outside of the main region; and the first structure exposes the fluid ports by retracting the extension panel to connect the fluid ports to a cooling fluid distribution system positioned in the two fluid system regions while the at least one of the server chassis is positioned in the main region.

14. The data center system of claim 10, wherein the first structure comprises the extension panel to move between a first position and a second position, the extension panel being retracted in the second position to physically expose the fluid ports, and the extension panel being extended in the first position to partially contain the fluid ports.

15. The data center system of claim 10, wherein the at least one of the server chassis further comprises:
an electronics area for housing:
an IT component, and
the one or more cooling modules; and
a power area for housing a power device operably connected to the power clip to receive the power,
wherein the first structure comprises a pair of extension panels positioned with a rear side of the at least one of the server chassis, the pair of extension panels positioned on opposite sides of the power area and segregated from the power area, and all of the pair of extension panels and the power area positioned on one side of the electronics area.

16. The data center system of claim 10, further comprising: a first rack manifold positioned in a first fluid system region of the two fluid system regions for fluid communication with the fluid ports while the at least one of the server chassis is positioned in the main region; and a second rack manifold positioned in a second fluid system region of the two fluid system regions for the fluid communication with the fluid ports while the at least one of the server chassis is positioned in the main region.

17. The data center system of claim 16, wherein the two fluid system regions are positioned along a rear of the electronic rack and the two fluid system regions are separated from each other by the power region, wherein the two fluid system regions are adapted to receive fluid distribution systems to distribute the cooling fluid.

18. The data center system of claim 17, further comprising: a fluid distribution system positioned in one of the two fluid system regions, wherein the fluid distribution system is fluidly connected to the fluid ports by moving the first structure to a retracted position that exposes the fluid ports, the first structure being moved to the retracted position by applying pressure to the first structure while the at least one of the server chassis is installed in the electronic rack.

* * * * *